(12) United States Patent
Ogawa et al.

(10) Patent No.: US 7,741,162 B2
(45) Date of Patent: *Jun. 22, 2010

(54) METHOD FOR MANUFACTURING HIGH-FREQUENCY MODULE DEVICE

(75) Inventors: Tsuyoshi Ogawa, Kanagawa (JP); Takahiko Kosemura, Kanagawa (JP); Akira Muto, Tokyo (JP); Akihiko Okubora, Kanagawa (JP)

(73) Assignee: Sony Corporation, Tokyo (JP)

( * ) Notice: Subject to any disclaimer, the term of this patent is extended or adjusted under 35 U.S.C. 154(b) by 98 days.

This patent is subject to a terminal disclaimer.

(21) Appl. No.: 11/710,785

(22) Filed: Feb. 26, 2007

(65) Prior Publication Data

US 2007/0155060 A1 Jul. 5, 2007

Related U.S. Application Data

(63) Continuation of application No. 10/496,878, filed as application No. PCT/JP03/011254 on Sep. 3, 2003, now Pat. No. 7,183,135.

(30) Foreign Application Priority Data

Sep. 30, 2002 (JP) ............................ P2002-286837

(51) Int. Cl.
*H01L 21/00* (2006.01)

(52) U.S. Cl. .................. 438/125; 438/108; 438/126; 438/381; 438/458; 438/622; 257/728; 257/E21.501; 257/E21.511

(58) Field of Classification Search .................. 438/107, 438/108, 123, 27, 125, 458, 622; 257/728, 257/E21.501, 511

See application file for complete search history.

(56) References Cited

U.S. PATENT DOCUMENTS

| 5,239,448 | A | * | 8/1993 | Perkins et al. | ............... | 361/764 |
| 6,919,226 | B2 | | 7/2005 | Ogawa et al. | | |
| 7,183,135 | B2 | * | 2/2007 | Ogawa et al. | ............... | 438/108 |

FOREIGN PATENT DOCUMENTS

| JP | 06-318783 | | 11/1994 |
| JP | 07-202427 | | 8/1995 |
| JP | 2002-164467 | * | 7/2002 |
| WO | WO 02/061827 | | 8/2002 |

OTHER PUBLICATIONS

Machine translation of JP 2002-164467.*

* cited by examiner

*Primary Examiner*—Charles D Garber
*Assistant Examiner*—Yasser A Abdelaziez
(74) *Attorney, Agent, or Firm*—Robert J. Depke; Rockey, Depke & Lyons, LLC

(57) ABSTRACT

This invention is a method for manufacturing a high-frequency module device. A high-frequency circuit unit (2) in which first to third unit wiring layers (5) to (7), each having a capacitor (12) or the like at a part, are stacked and formed on flattened one surface of a dummy board (30) so that a third pattern wiring is exposed from a connection surface (2a) of an uppermost layer is mounted on a mounting surface (3a) of a base board (3) where an input/output terminal part (18) is exposed, in such a manner that the third pattern wiring and the input/output terminal part are connected with each other, and after that, the dummy board is removed. A high-frequency module device is thus manufactured.

4 Claims, 21 Drawing Sheets

METHOD FOR MANUFACTURING HIGH-FREQUENCY MODULE DEVICE

The subject matter of application Ser. No. 10/496,878 is incorporated herein by reference. The present application is a Continuation of U.S. Ser. No. 10/496,878, filed May 26, 2004, now U.S. Pat. No. 7,183,135 which is a U.S. National Stage of PCT Application No. PCT JP03/011254, filed Sep. 3, 2003, which claims priority to Japanese Patent Application No. JP 2002-286837 filed Sep. 30, 2002, all of which applications are incorporated herein by reference.

TECHNICAL FIELD

This invention relates to a method for manufacturing a high-frequency module device having a high-frequency circuit unit on which a passive element is provided, and particularly to a method for manufacturing a high-frequency module device with reduced size and thickness.

This application claims priority of Japanese Patent Application No.2002-286837, filed on Sep. 30, 2002, the entirety of which is incorporated by reference herein.

BACKGROUND ART

Conventionally, digitization of data has enabled easy handling of various information such as music, sounds and images by a personal computer, mobile computer and the like. An audio codec technique and a video codec technique have realized band compression of such information, and an environment for easily and efficiently distributing the information to various communication terminal devices via digital communication or digital broadcasting is almost complete. For example, audio and video data (AV data) can be received outdoors by a portable telephone.

Since networks suitable for home or a small region have been proposed, transmitter-receiver systems for data are used for various purposes. As such network systems, various next-generation wireless systems attract attention such as a narrow-band radio communication system with a 5-GHz band as proposed in IEEE802.11a, a radio LAN system with a 2.45-GHz band as proposed in IEEE802.11b, or a short-distance radio communication system called Bluetooth.

In a transmitter-receiver system for data, using such a wireless network system effectively, it is possible to transmit and receive various data easily at various places such as home or outdoors and without using repeaters, and to access and transmit/receive data to/from the Internet.

Meanwhile, for a transmitter-receiver system for data, it is essential to realize a communication terminal device that is small-sized, light-weight and portable and has the above-described communication function. In the communication terminal device, since modulation/demodulation processing of analog high-frequency signals must be performed in a transmitter-receiver unit, generally, a high-frequency transmitter-receiver circuit 100 of a superheterodyne system for converting a transmitted/received signal to an intermediate frequency is provided, as shown in FIG. 1.

The high-frequency transmitter-receiver circuit 100 shown in FIG. 1 has an antenna unit 101 including an antenna and a changeover switch and adapted for receiving or transmitting information signals, and a transmission/reception switching unit 102 for switching transmission and reception. In the high-frequency transmitter-receiver circuit 100, a receiver circuit unit 105 is provided which includes a frequency converter circuit part 103, a demodulator circuit part 104 and the like. In the high-frequency transmitter-receiver circuit 100, a transmitter circuit unit 109 is provided which includes a power amplifier 106, a drive amplifier 107, a modulator circuit part 108 and the like. In the high-frequency transmitter-receiver circuit 100, a reference frequency generator circuit unit is provided which supplies a reference frequency to the receiver circuit unit 105 and the transmitter circuit unit 109.

Although not described in detail, the high-frequency transmitter-receiver circuit 100 of the above-described structure has a very large number of components including various filters inserted between individual stages, large functional components such as a voltage controller oscillator (VCO) and a surface acoustic wave (SAW) filter, and passive components such as inductors, resistors and capacitors proper to a high-frequency analog circuit like a matching circuit or bias circuit. Therefore, the high-frequency transmitter-receiver circuit 100 has a large size as a whole, which is a big problem in reducing the size and weight of the communication terminal device.

In the communication terminal device, a high-frequency transmitter-receiver circuit 110 of a direct conversion system for transmitting and receiving information signals without converting them to an intermediate frequency, as shown in FIG. 2, may also be used. In the high-frequency transmitter-receiver circuit 110, an information signal received by an antenna unit 111 is supplied to a demodulator circuit unit 113 via a transmission/reception switching unit 112 and baseband processing is directly performed. In the high-frequency transmitter-receiver circuit 111, an information signal generated by a source is directly modulated to a predetermined frequency band by a modulator circuit unit 114 without being converted to an intermediate frequency and is then transmitted from the antenna unit 111 via an amplifier 115 and the transmission/reception switching unit 112.

In the high-frequency transmitter-receiver circuit 110 of the above-described structure, since it is constructed to transmit and receive an information signal by performing direct detection without converting the information signal to an intermediate frequency, the number of components such as filters can be reduced and the overall structure is simplified. Therefore, a structure similar to one chip is expected. However, also in the high-frequency transmitter-receiver circuit 110, it is necessary to consider a filter or matching circuit arranged on a latter stage. In the high-frequency transmitter-receiver circuit 110, since amplification is performed once at a high-frequency stage, it is difficult to acquire sufficient gain and an amplification operation must be performed also in a baseband part. Therefore, the high-frequency transmitter-receiver circuit 110 has a problem that a DC offset cancellation circuit and a low-pass filter are needed, increasing the overall power consumption.

Whether the superheterodyne system or the direct conversion system, the conventional high-frequency transmitter-receiver circuit does not have sufficient properties to meet the requirements such as reduction in size and weight of the communication terminal device. Therefore, for the high-frequency transmitter-receiver circuit, various attempts are made to construct a small-sized module using a simple structure based on, for example, a Si-CMOS circuit or the like. One such attempt is a method for manufacturing a so-called one-chip high-frequency circuit board, for example, by forming a passive element with good properties on a Si substrate, constructing a filter circuit, a resonator and the like on an LSI (large-scale integrated circuit) and also integrating a logic LSI of a baseband part.

In such a one-chip high-frequency circuit board, how to form an inductor 120 having good performance is extremely important, as shown in FIG. 3. In this high-frequency circuit board, a large recess part 124 is formed corresponding to an inductor forming part 123 in a Si substrate 121 and a $SiO_2$ insulating layer 122. In this high-frequency circuit board, a first wiring layer 125 is formed in such a manner that it is exposed to the recess part 124, and a second wiring layer 126 is formed on the $SiO_2$ insulating layer 122, thus forming a coil part 127. Moreover, in the high-frequency circuit board, as another feature, a part of the wiring pattern is lifted up in the air from the surface of the substrate, thus forming the inductor 120.

In this high-frequency circuit board, since the process of forming the inductor includes many steps and is complex, there is a problem of increase in the manufacturing cost. In this high-frequency circuit board, electrical interference of the Si substrate existing between a high-frequency circuit unit of an analog circuit and a baseband circuit unit of a digital circuit may become a large problem.

As high-frequency circuit boards that overcome the above-described problems, a high-frequency module device 130 using a Si substrate, as shown in FIG. 4, and a high-frequency module device 140 using a glass substrate, as shown in FIG. 5, are proposed.

In the high-frequency module device 130 shown in FIG. 4, a Si substrate is used as a base board 131. After a $SiO_2$ layer 132 is formed on the base board 131, a passive element layer 133 is formed by a thin film forming technique such as a lithography technique. In the high-frequency module device 130, though described in detail, a wiring layer 134 and passive element parts 135 such as inductors, resistors and capacitors are formed in a multilayer structure via insulating layers 136 in the passive element layer 133.

In the high-frequency module device 130, terminal parts 137 connected with the wiring layer 134 through via-holes (through-holes) are formed on the passive element layer 133, and functional elements 138 such as high-frequency. ICs and LSIs are mounted on these terminal parts 137 by a flip-chip mounting method or the like. In this high-frequency module device 130, for example, as it is mounted on a mother board or the like, the high-frequency circuit unit and the baseband circuit unit are discriminated and electrical interference of these circuit units is restrained.

Meanwhile, in this high-frequency module device 130, since the base board 131 is an electrically conductive Si substrate, when forming the passive element parts 135 in the passive element layer 133, the base board 131 may disturb good high-frequency characteristics of the passive element parts 135.

In the high-frequency module device 140 shown in FIG. 5, a glass substrate is used as a base board 141 in order to solve the problem of the base board 131 in the above-described high-frequency module device 130 shown in FIG. 4. Also in the high-frequency module device 140, a passive element layer 142 is formed on the base board 141, for example, by a thin film forming technique or the like. In the high-frequency module device 140, though not described in detail, a wiring layer 143 and passive element parts 144 such as inductors, resistors and capacitors are formed in a multilayer structure via insulating layers 145 in the passive element layer 142.

In the high-frequency module device 140, terminal parts 146 connected with the wiring layer 143 through via-holes are formed on the passive element layer 142, and functional elements 147 such as high-frequency ICs and LSIs are mounted on these terminal parts 146 by a flip-chip mounting method or the like. In this high-frequency module device 140, since a non-conductive glass board is used as the base board 141, capacitive coupling of the base board 141 and the passive element layer 142 is restrained and a passive element part 144 having good high-frequency characteristics is formed in the passive element layer 142. In this high-frequency module device 140, for example, for mounting on a mother board or the like, terminal patterns are formed on the surface of the passive element layer 142 and connection with the mother board is made by a wiring bonding method or the like.

In these high-frequency module devices 130, 140, the passive element layers 133, 143 of high accuracy are formed on the base boards 131, 141, as described above. When performing thin film formation of the passive element layers on the base boards 131, 141, heat resistance to a rise in the temperature of the surface at the time of sputtering, maintenance of the depth of focus at the time of lithography, and contact alignment property at the time of masking are necessary.

Therefore, the base boards 131, 141 must be flattened highly accurately and need to have insulation property, heat resistance, chemical resistance and the like. Since the above-described base boards 131, 141 are Si and glass boards, they have such properties and therefore enable formation of passive elements with low loss at a low cost in a separate process from LSI formation.

In the above-described high-frequency module devices 130, 140, the base boards 131, 141 enables formation of passive elements of high accuracy, compared with a pattern forming method based on printing, which is used in the conventional ceramic module technique, or a wet etching method for forming a wiring pattern on a printed wiring board. The base boards 131, 141 also enable reduction in the size of elements to approximately 1/100 of the area. In the high-frequency module devices 130, 140, by using Si and glass substrates as the base boards 131, 141, it is possible to increase the threshold frequency of the passive elements to 20 GHz or higher.

In these high-frequency module devices 130, 140, pattern formation for a high-frequency signal system and formation of supply wirings such as power source and ground or signal wirings for a control system are carried out via the wiring layers 134, 143 formed on the base boards 131, 141 as described above. Therefore, in the high-frequency module devices 130, 140, problems arise such as occurrence of electrical interference between the wirings, increase in the cost due to the formation of the wiring layers in the multilayer form, and increase in the size due to the arrangement of the wirings.

In these high-frequency module devices 130, 140, there is also a problem of increase in the cost due to the user of relative expensive Si and glass substrates as the base boards 131, 141.

These high-frequency module devices 130, 140 are mounted as so-called one-chip components on a major surface of a mother board 150, as shown in FIG. 6. Here, the high-frequency module device 130 is used for the description.

On one side of the mother board 150, the high-frequency module device 130 is mounted and also a shield cover 151 made of an insulating resin or the like covering the entire high-frequency module device 130 is mounted. On the front and back sides of the mother board 150, pattern wirings, input/output terminal parts and the like are formed and many land parts 152 are formed around the region where the high-frequency module device 130 is mounted.

In the case of mounting the high-frequency module device 130 on the mother board 150, the wiring layer 134 of the high-frequency module device 130 and the land parts 152 are electrically connected by wires 153, using a wire bonding method, so that power supply to and transmission of signals to/from the high-frequency module device 130 are performed. Also the high-frequency module device 140 is similarly mounted on the mother board 150.

With the high-frequency module device 130 mounted on the mother board 150, as the passive element layer 133 is arranged on the mother board 150 via the base board 131, there is a problem of increased size in the direction of thickness.

Moreover, with the high-frequency module device 130 mounted on the mother board 150, it is difficult to provide a wiring structure within the base board 131 and many land parts 152 for supplying power are arranged around the high-frequency module device 130. Therefore, there is a problem of increased size in the planar direction.

As means for solving such problems, a high-frequency module device 160 as shown in FIG. 7 or the like is proposed (see JP-A-2002-94247).

In this high-frequency module device 160, flattening processing is performed on a major surface of a base board 161 made of an organic wiring board or the like, and a high-frequency element layer part 162 having passive elements is formed on the highly flattened major surface of the base board 161 by a thin film forming technique or the like.

In the high-frequency module device 160 of this structure, since electricity and signals can be supplied to the high-frequency element layer part 162 by the base board 161, which is an organic wiring board, without using the wires 153 in the case of the above-described high-frequency module device 150, highly regulated power supply can be carried out. Moreover, in this high-frequency module device 160, since the base board 161 is an organic wiring board, the cost can be reduced compared with the case of using a Si substrate or glass substrate as the base board.

In the above-described high-frequency module device 160, the high-frequency element layer part 162 is sequentially stacked and formed on one side of the base board 161. Since the high-frequency element layer part 162, which takes a high manufacturing cost, is formed on the entire major surface of the base board 161, it is difficult to realize miniaturization and reduction in cost.

DISCLOSURE OF THE INVENTION

It is an object of this invention to provide a manufacturing method that enables manufacture of a new high-frequency module device capable of solving the problems of the conventional techniques as described above.

It is another object of this invention to provide a method for manufacturing a high-frequency module device that enables accurate formation of passive elements and wiring parts.

It is still another object of this invention to provide a manufacturing method that enables manufacture of a high-frequency module device reduced with a smaller size and at a lower price.

A method for manufacturing a high-frequency module device according to this invention includes: a circuit unit forming step of forming a high-frequency circuit unit in which plural unit wiring layers, each including a wiring layer having a passive element provided at a part and an insulating layer, are stacked and formed on flattened one surface of a dummy board so that their respective wiring layers are electrically interconnected, the wiring layer being exposed from a major surface of an uppermost layer of the unit wiring layers; a mounting step of mounting the high-frequency circuit unit on a major surface of a base board having a connection part formed thereon so that the connection part and the wiring layer exposed on the major surface of the uppermost layer of the unit wiring layers are joined with each other; and a removing step of removing the dummy board from the high-frequency circuit unit mounted on the major surface of the base board.

In the manufacturing method according to this invention, after the high-frequency circuit unit in which the plural unit wiring layers are stacked and formed on the flattened one surface of the dummy board is mounted on the one surface of the base board so that the wiring layer exposed on the uppermost layer of the unit wiring layers and the connection part formed on the one surface of the base board are joined with each other, the dummy board is removed from the high-frequency circuit unit. Thus, a high-frequency module device having a high-frequency circuit unit mounted within a predetermined range on one surface of a base board is manufactured.

In the method for manufacturing a high-frequency module device according to this invention, since the high-frequency circuit unit is formed on the flattened one surface of the dummy board, a high-frequency module device in which the wiring layer having the passive element is accurately formed can be manufactured.

Moreover, in this manufacturing method, as only the necessary part of the high-frequency circuit unit that is accurately formed is formed on one surface of the dummy board, it is possible to mount only the necessary part of the high-frequency circuit unit on the base board. Therefore, a high-frequency module device with a smaller size and lower cost can be manufactured.

The other objects of this invention and specific advantages provided by this invention will be further clarified by the following description of embodiments described with reference to the drawings.

BRIEF DESCRIPTION OF THE DRAWINGS

FIG. 3A is a perspective view showing its essential part. FIG. 3B is a longitudinal sectional view showing its essential part;

BEST MODE FOR CARRYING OUT THE INVENTION

Hereinafter, the method for manufacturing a high-frequency module device according to this invention will be described with reference to the drawings.

First, a high-frequency module device manufactured by the manufacturing method according to this invention will be described with reference to FIG. 8.

Figure 1:
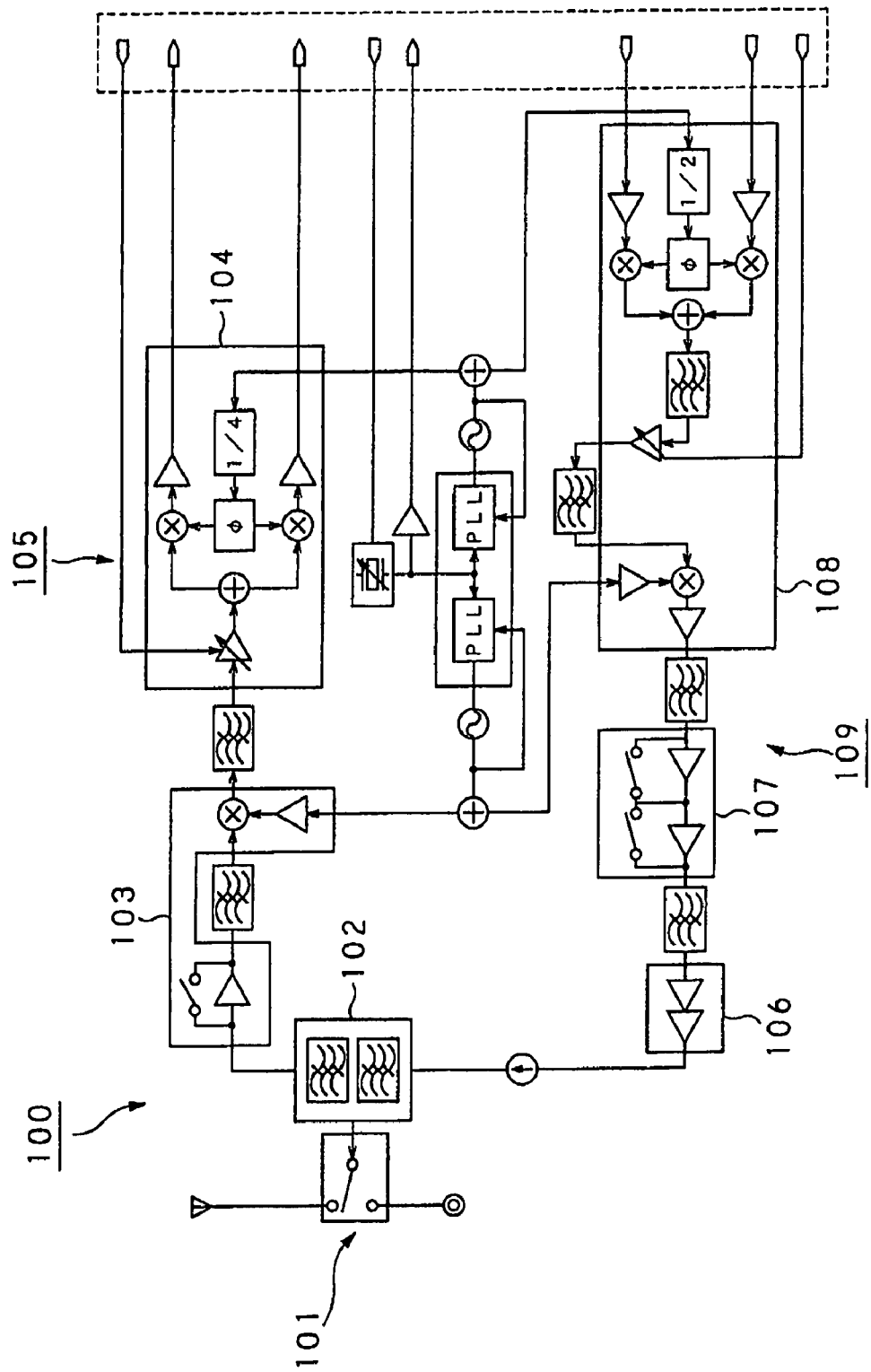
FIG. 1 is a block diagram showing a high-frequency transmitter-receiver circuit based on a superheterodyne system.
Figure 2:
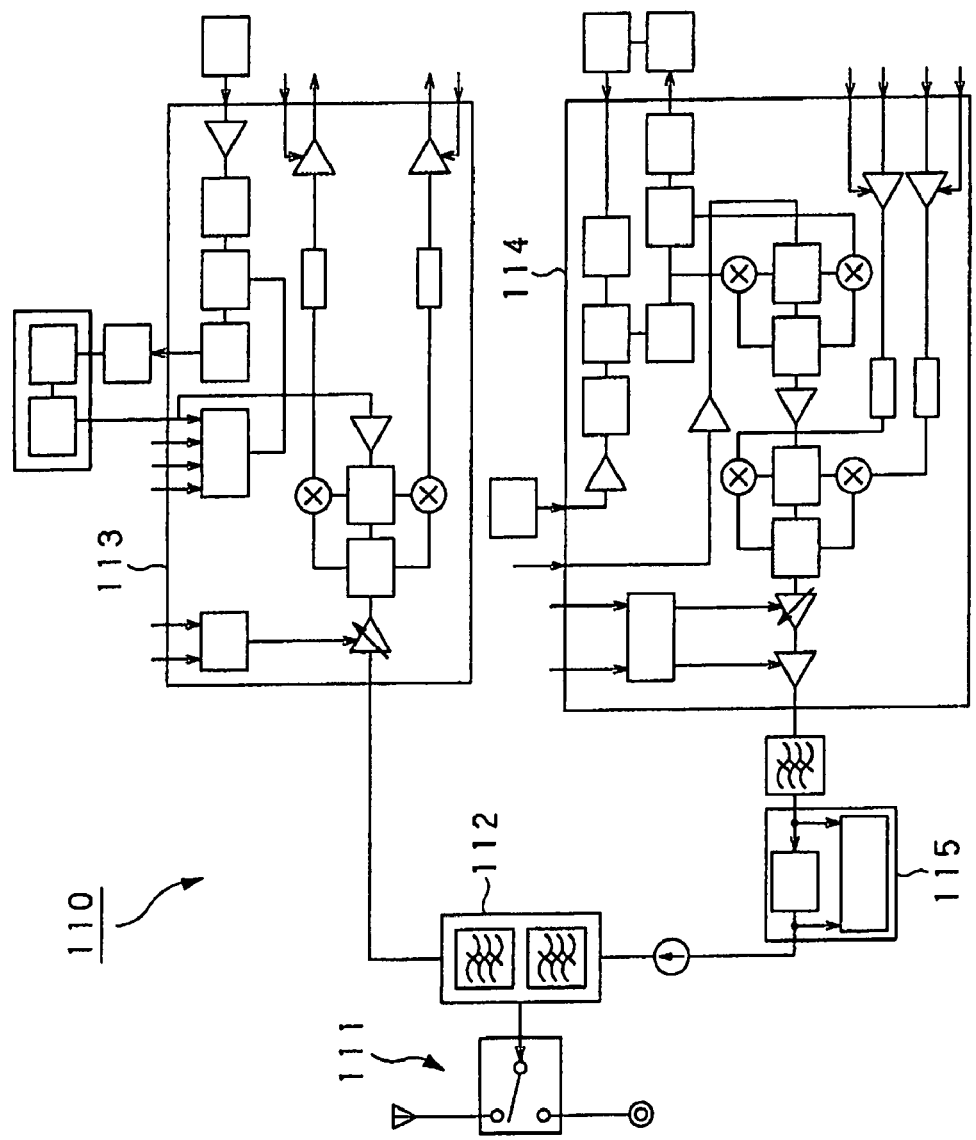
FIG. 2 is a block diagram showing a high-frequency transmitter-receiver circuit based on a direct conversion system.
Figure 3A:
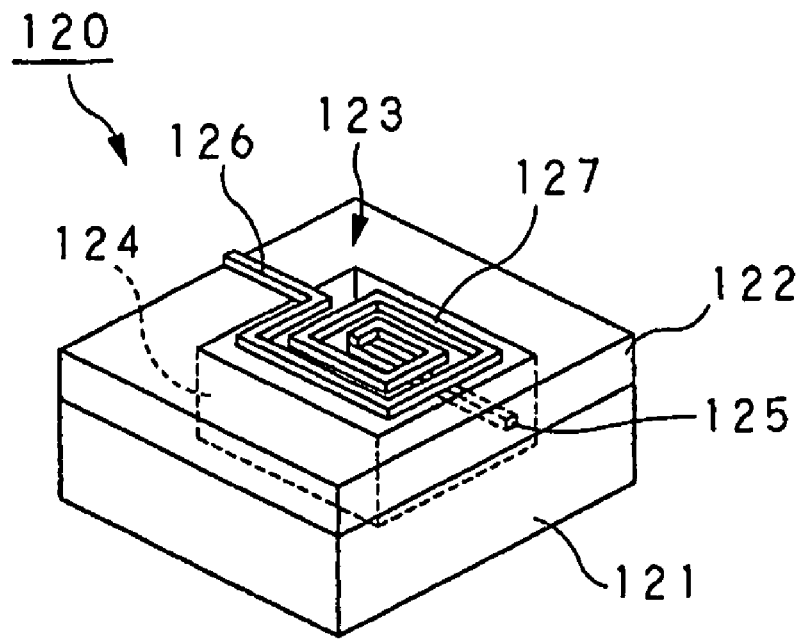
FIGS. 3A and 3B are views showing an inductor provided on a conventional high-frequency circuit board.
Figure 3B:
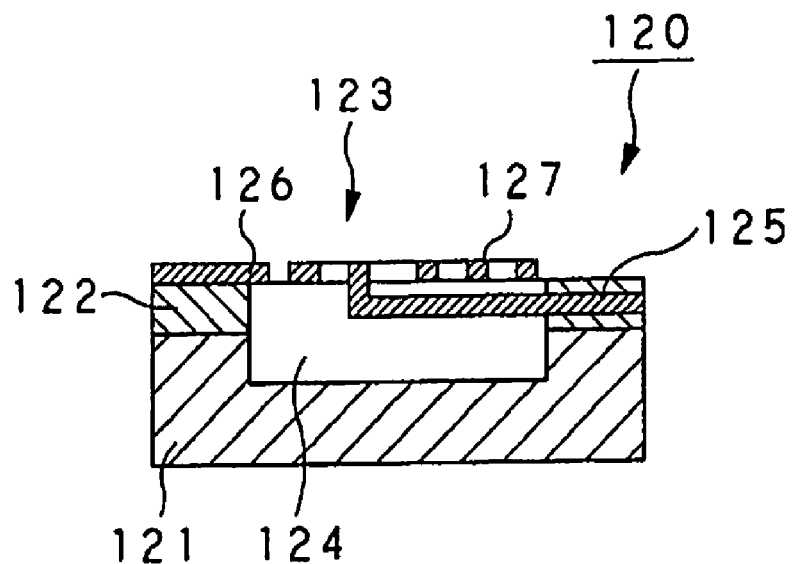
Figure 4:
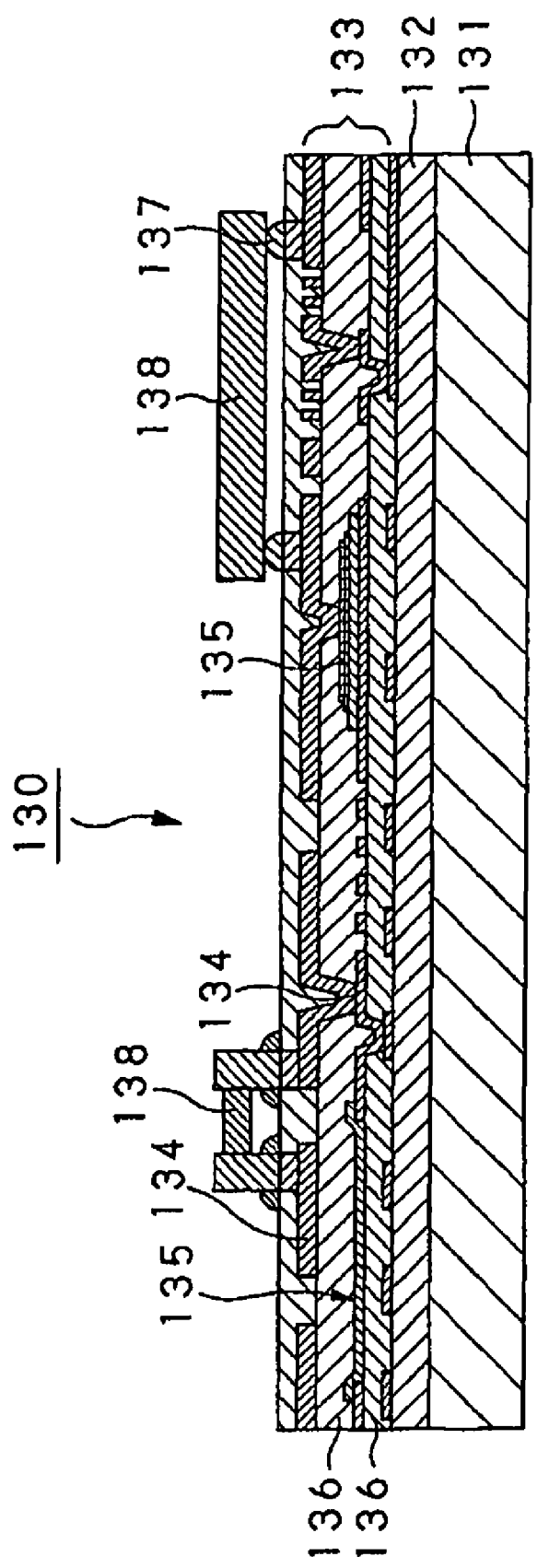
FIG. 4 is a longitudinal sectional view showing a structure in which a silicon substrate is used as a base board of a conventional high-frequency module device.
Figure 5:
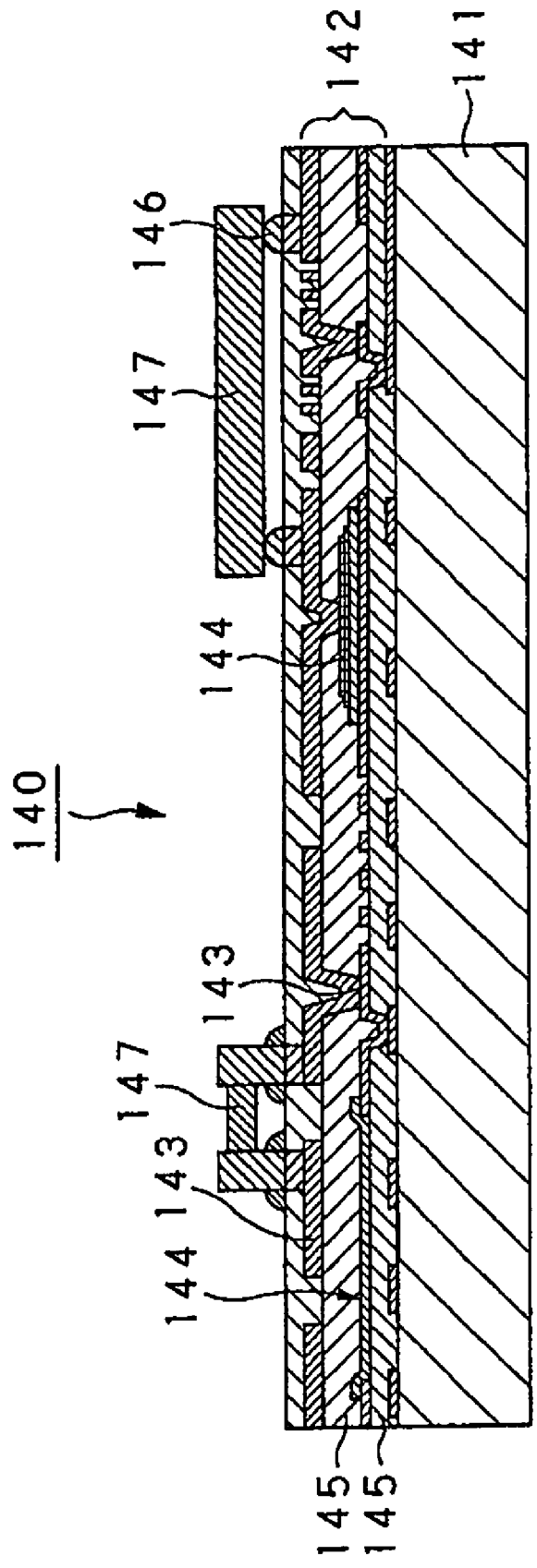
FIG. 5 is a longitudinal sectional view showing a structure in which a glass substrate is used as a base board of a high-frequency module device.
Figure 6:
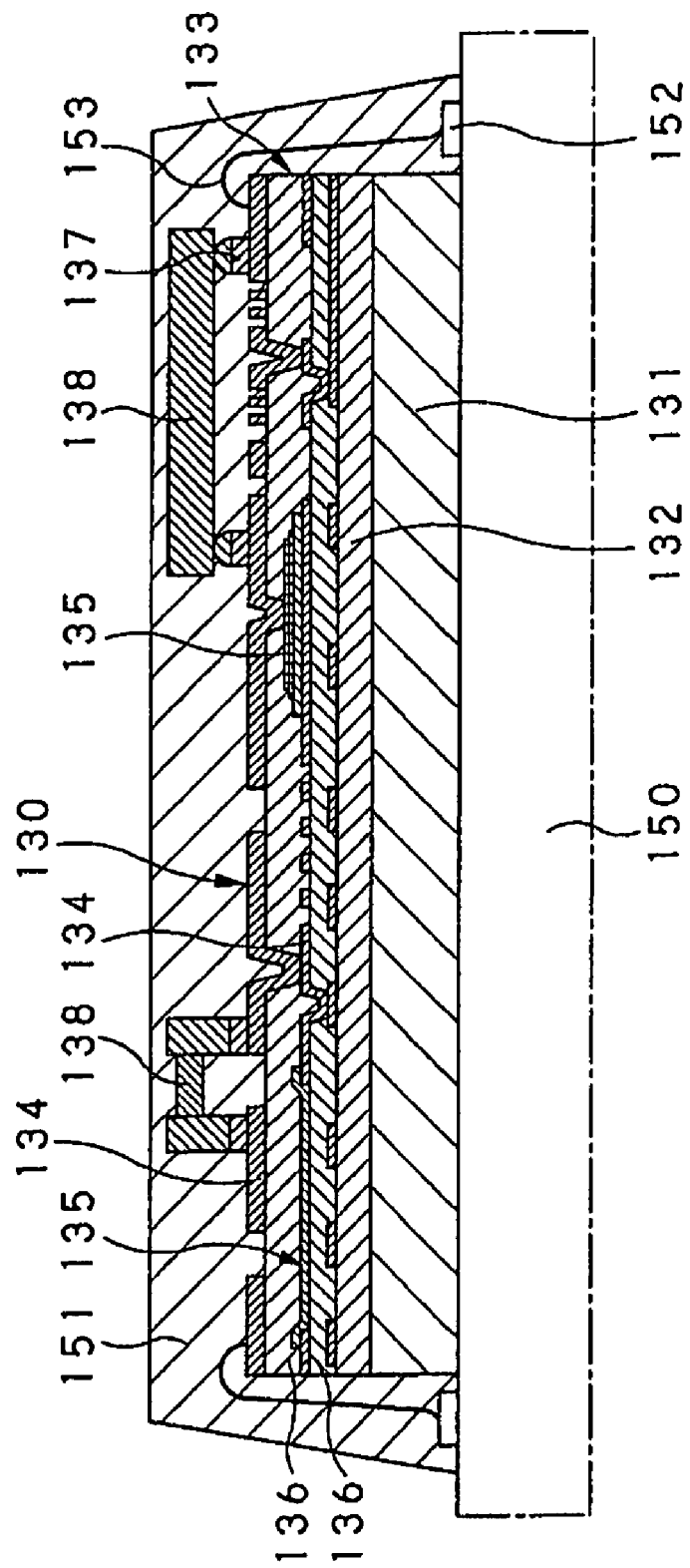
FIG. 6 is a longitudinal sectional view showing a state where a high-frequency module device is mounted on a mother board.
Figure 7:
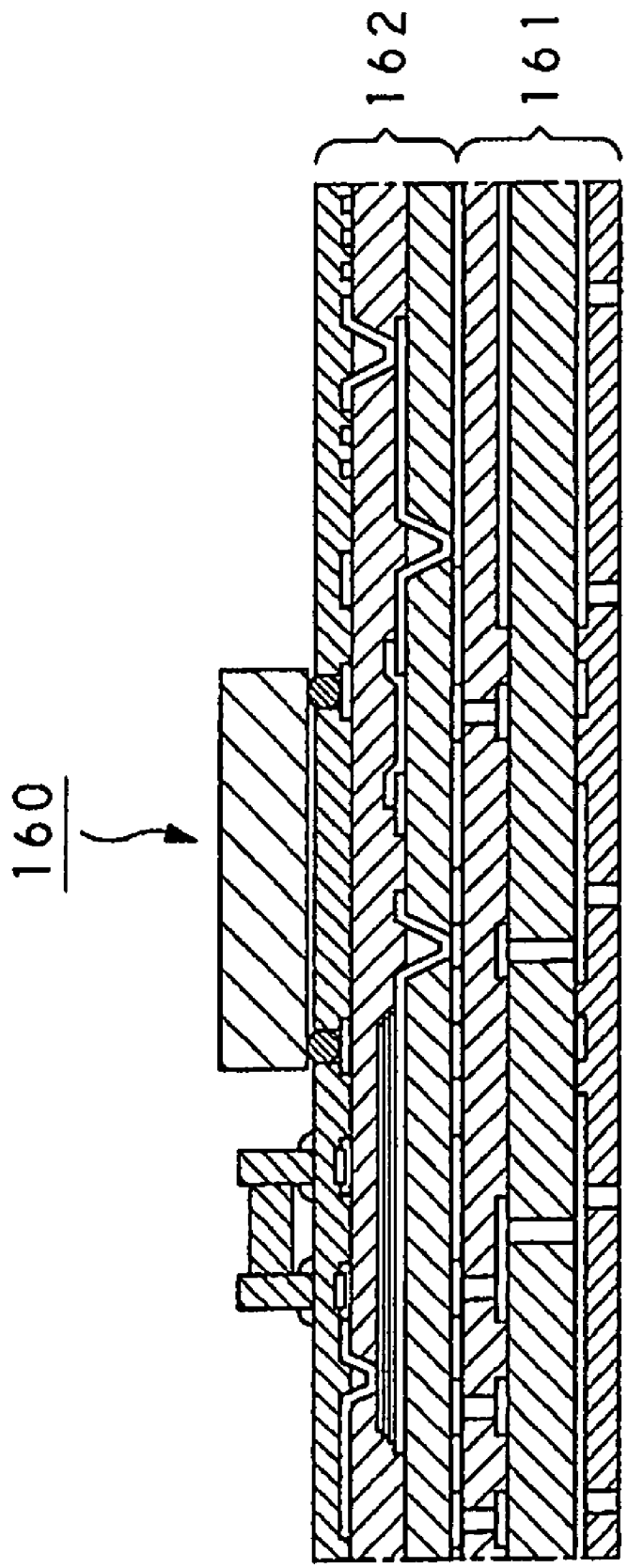
FIG. 7 is a longitudinal sectional view showing a structure in which an organic wiring board is used as a base board of a high-frequency module device.
Figure 8:
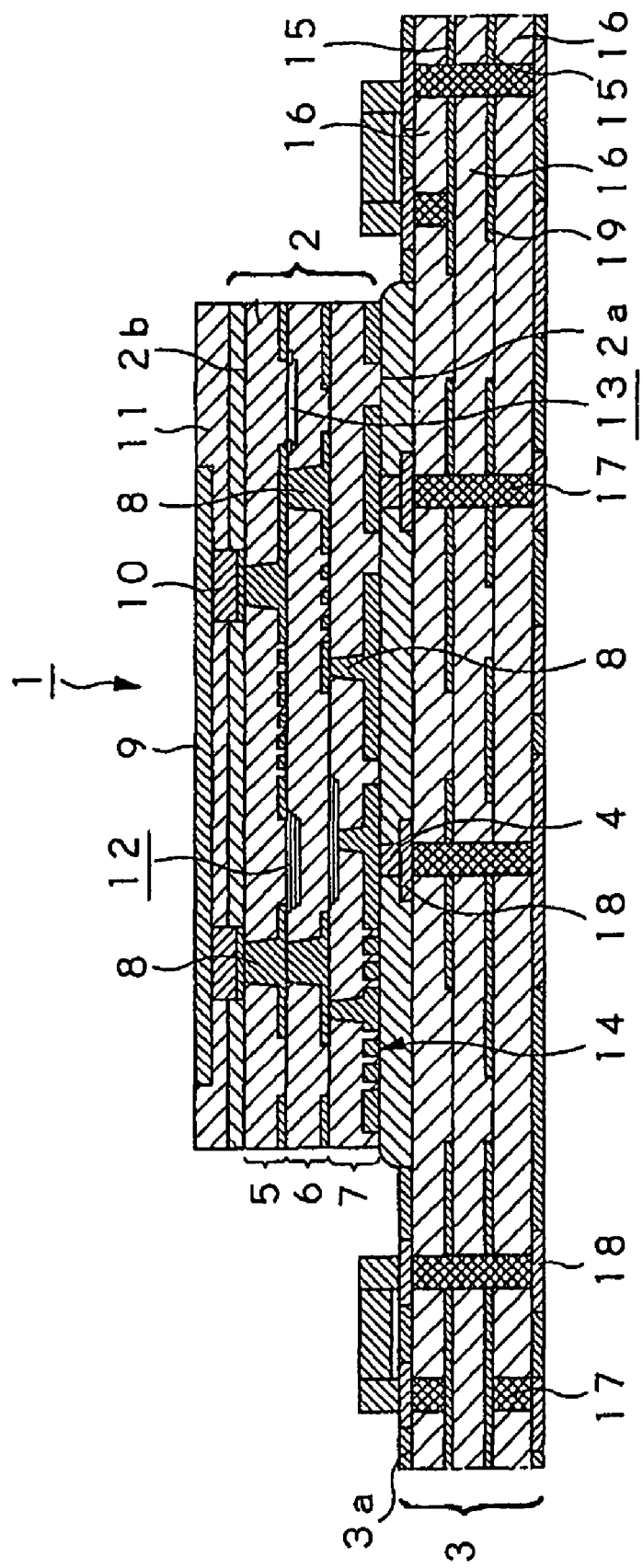
FIG. 8 is a sectional view showing an example of a high-frequency module device manufactured by a method for manufacturing a high-frequency module device to which this invention is applied.

A high-frequency module device 1 shown in FIG. 8 constitutes a high-frequency circuit for performing exchange processing or the like of a high-frequency signal using a superheterodyne system, direct conversion system or the like in a transmitter-receiver unit provided in a portable communication terminal device or the like.

This high-frequency module device 1 has a structure in which a high-frequency circuit board having a high-frequency circuit unit 2 formed thereon is electrically connected and mounted on a base board 3 with a bump part 4 made of, for example, solder or the like. In this high-frequency circuit unit 2, a second unit wiring layer 6 is formed under one side of a first unit wiring layer 5, and a third unit wiring layer 7 is formed under one side of the second unit wiring layer 6. Each of these first to third unit wiring layers 5 to 7 includes an insulating layer and a pattern wiring.

In the high-frequency circuit unit 2, the first to third wiring unit wiring layers 5 to 7 are electrically interconnected by a via-hole 8 penetrating all these layers or penetrating the vertically adjacent layers. In the high-frequency circuit unit 2, one side of each of the first to third unit wiring layers 5 to 7 is flattened by chemical-mechanical polishing (CMP), thus enabling formation of a via-on-via structure in which, for example, the via-hole 8 in the first unit wiring layer 5 and the via-hole 8 in the second unit wiring layer 6 are aligned with each other. In the high-frequency circuit unit 2, since one side of each of the first to third unit wiring layers 5 to 7 is flattened, the pattern wiring in each unit wiring layer on the upper side can be accurately formed.

On a side 2b of the high-frequency circuit unit 2 that is opposite to a surface 2a facing the base board 3 (hereinafter referred to as connecting side), a functional element 9 such as a semiconductor chip and LSI (large-scale integrated circuit), or a surface-mounted component, not shown, is electrically connected with the pattern wiring of the first unit wiring layer 5 by an element bump part 10 formed by a flip-chip bonding method or the like.

In the high-frequency circuit unit 2, a resin layer 11 is formed on one side of the first unit wiring layer 5 in a manner of filling the surrounding of the functional element 9, and as these functional element 9 and resin layer 11 are polished, reduction in the overall thickness is realized.

In the high-frequency circuit unit 2, passive elements such as a capacitor 12, a resistor 13 and an inductor 14 are formed at predetermined positions in the pattern wirings of the first to third unit wiring layers 5 to 7. The capacitor 12 is, for example, a decoupling capacitor or CD-cut capacitor and is formed by a tantalum oxide (TaO) thin film. The resistor 13 is, for example, a terminating resistor and is formed by a tantalum nitride (TaN) thin film.

In the high-frequency circuit unit 2, since each surface of the first to third unit wiring layers 5 to 7 is flattened as described above, such passive elements can be accurately formed. In this manner, in the high-frequency circuit unit 2, since the passive elements such as the capacitor 12 are accurately formed as thin films in the individual unit wiring layers without using a semiconductor chip or the like, small-sized and high-performance passive elements can be mounted.

As will be later described in detail, the high-frequency circuit unit 2 is formed by sequentially stacking and forming the first to third unit wiring layers 5 to 7 on a dummy board 30 having a flat surface via a strip layer 31 and then removing the dummy board 30 and the strip layer 31. Therefore, in the high-frequency circuit unit 2, it is possible to formed only necessary parts on the dummy board 30. With the structure of this high-frequency circuit unit 2, in which a base board made of a glass substrate, Si substrate or the like is not used, the cost can be significantly reduced, compared with the conventional technique.

Meanwhile, in the base board 3, plural wiring layers 15 are constructed in the individual layers via insulating layers 16, and the plural wiring layers 15 are interconnected across the individual layers through via-holes 17 penetrating all the layers or penetrating plural layers. On both sides of the base board 3, plural input/output terminal parts 18 are provided, and these input/output terminal parts 18 function, for example, as connection terminals to an external power source or as bases of the bump parts 4 for mounting the high-frequency circuit unit 2. In the base board 3, the plural wiring layers 15 function as wirings for transmitting power, control signals, high-frequency signals and the like supplied from the input/output terminal parts 18 to the high-frequency circuit unit 2, and also function as ground parts (earth electrodes) 19.

In the base board 3, a material having a low Tanδ at a low dielectric constant, that is, a good high-frequency characteristic, for example, an organic material such as polyphenylene ether (PPE), bis-maleidtriazine (BT-resin), polytetrafluoroethylene, polyimide, liquid crystal polymer (LCP), polynorbornene (PNB), phenol resin or polyolefin resin, an inorganic material such as ceramics, or a mixture of an organic material and an inorganic material such as glass epoxy, is used as a material of the insulating layers 16. The base board 3 is manufactured by a typical multilayer wiring board manufacturing process.

Figure 9:
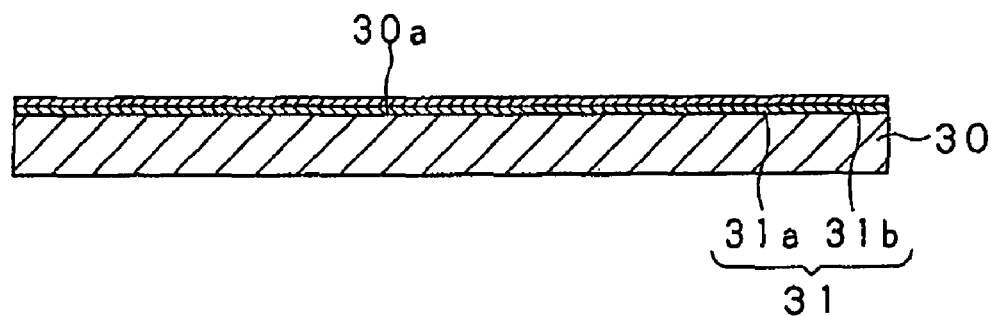
FIG. 9 is a longitudinal sectional view showing a dummy board, for explaining the method for manufacturing a high-frequency module device according to this invention.

Next, the method for manufacturing the above-described high-frequency module device 1 will be described. For the high-frequency module device 1, first, the high-frequency circuit unit 2 is prepared. When preparing the high-frequency circuit unit 2, a dummy board 30 with a strip layer 31 formed on its one side 30a is prepared, as shown in FIG. 9. As the dummy board 30, a glass substrate, quartz substrate, Si substrate or the like having high heat resistance and a highly flattened major surface is used. The strip layer 31 includes a metal film 31a of copper, aluminum or the like formed with a uniform thickness of approximately 1000 Å over the entire major surface 30a of the dummy board 30 by a thin film forming technique such as a sputtering method or chemical vapor deposition (CVD) method, and a resin film 31b of a polyimide resin or the like formed with a thickness of approximately 1 to 2 μm over the entire surface of the metal film 31a by a spin coat method or the like.

Figure 10:
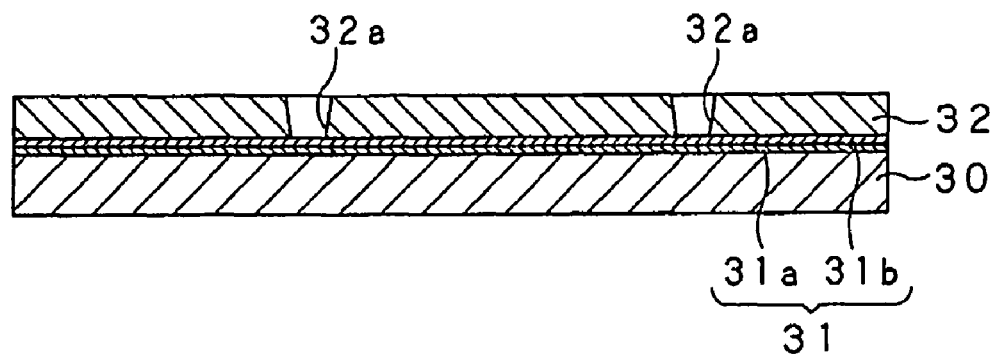
FIG. 10 is a longitudinal sectional view showing a state where a first insulating layer is formed on the dummy board.

Next, a first insulating layer 32 with a uniform thickness is formed on the strip layer 31, as shown in FIG. 10. The first insulating layer 32 is formed using an insulating dielectric material that is typically known in the conventional wiring board manufacturing process. As the first insulating layer 32, an insulating dielectric material having a low Tan δ at a low dielectric constant, that is, a good high-frequency characteristic, for example, polyphenylene ether (PPE), bis-maleidtriazine (BT-resin), liquid crystal polymer (LCP), polynorbornene (PNB), bis-maleidtriazine (BT-resin), polyimide, benzocyclobutene (BCB), epoxy resin, acrylic resin or the like is used. The first insulating layer 32 is formed by applying the insulating dielectric material onto the strip layer 31, using a spin coat method, curtain coat method, roll coat method, dip coat method or the like.

Next, in the first insulating layer 32, an opening 32a to be the via-hole 8 is formed at a predetermined position by patterning processing. The opening 32 is formed as patterning processing is performed on the first insulating layer 32. In the case where a photosensitive insulating dielectric material is used for the first insulating layer 32, the opening 32 is formed by patterning processing based on a photolithography technique. In the case where a non-photosensitive insulating dielectric material is used for the first insulating layer 32, the opening 32 is patterned by dry etching or laser processing with a photoresist, aluminum mask or the like.

Figure 11:
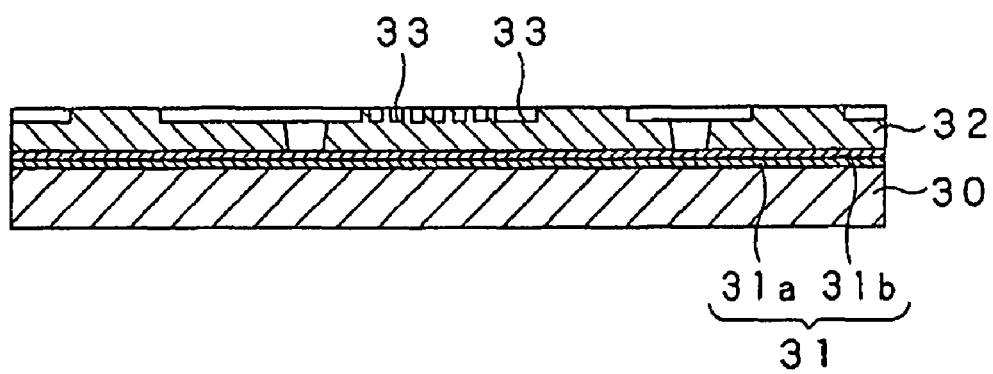
FIG. 11 is a longitudinal sectional view showing a state where a first wiring groove is formed on the first insulating layer.

Next, etching processing is performed on the first insulating layer 32 and a first wiring groove 33 is formed, as shown in FIG. 11. After an etching mask having an opening corresponding to the pattern of the first wiring groove 33 is formed on the first insulating layer 32, and dry etching such as reactive ion etching (RIE), for example, using oxygen plasma, is performed in the area except for the etching mask of the first insulating layer 32, the etching mask is removed. The first wiring groove 33 is thus formed.

Figure 12:
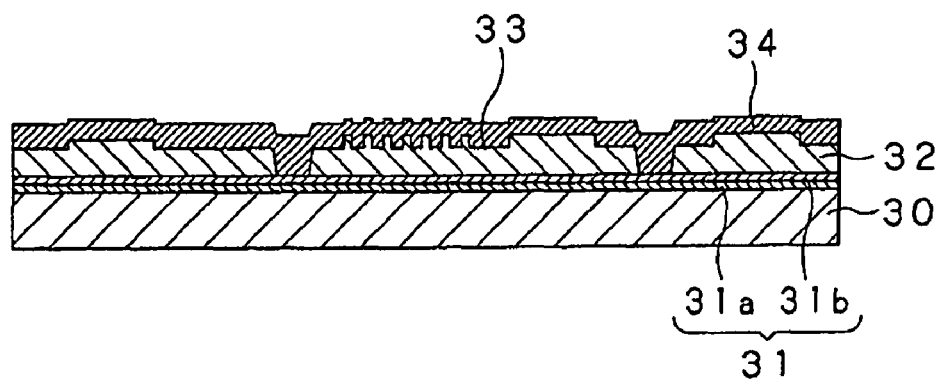
FIG. 12 is a longitudinal sectional view showing a state where a metal plating layer is formed on the first insulating layer.

Next, as metal plating processing is performed on the first insulating layer 32 with the first wiring groove 33 formed thereon, as shown in FIG. 12, a metal plating layer 34 is formed. The metal plating layer 34 is made of a highly conductive metal such as copper. The metal plating processing may be either electroplating or electroless plating. It is performed in such a manner that the metal plating layer 34 fills the entire major surface of the first insulating layer 32 where the first wiring groove 33 is provided and the opening 32a and so that the thickest part of the metal plating layer 34 is thicker than the thickest part of the first insulating layer 32. In the case of forming the metal plating layer 34 by electroplating, the metal film 31a of the strip layer 31 functions as a voltage applying electrode in the metal plating processing.

Figure 13:
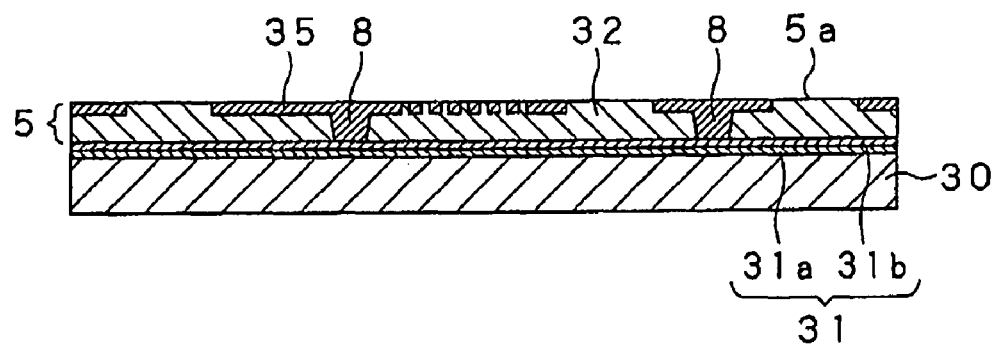
FIG. 13 is a longitudinal sectional view showing a state where a first unit wiring layer is formed.

Next, as flattening processing is performed on the metal plating layer 34 until the first insulating layer 32 is exposed, as shown in FIG. 13, a first pattern wiring 35 is formed on the major surface of the first insulating layer 32. The first insulating layer 32 and the first pattern wiring 35 are thus formed on the strip layer 31, and the first unit wiring layer 5 having a major surface 5a that is highly flattened by the flattening processing is formed. For simultaneously polishing the first insulating layer 32 and the metal plating layer 34 that are made of different materials, chemical-mechanical polishing (CMP) is used as the flattening processing. This CMP method enables material-selective polishing so that the polishing rate of the metal plating layer 34 made of a metal such as copper becomes higher. This CMP method enables highly accurate polishing of the polishing surface.

In the case where a photosensitive insulating dielectric material is used for the first insulating layer 32, since the first insulating layer 32 is formed on the highly flattened major surface 30a of the dummy board 30 and the thickness of the first insulating layer 32 is not varied, deviation of the focal point of a patterning image by photolithography processing is restrained and the first pattern wiring 35 and the via-hole 8 can be formed accurately in this first unit wiring layer 5.

The first unit wiring layer 5 is thus formed with the first pattern wiring 35 embedded in the first insulating layer 32. The major surface 5a is accurately flattened by flattening processing based on the CMP method, and the via-hole 8 is formed at the same time. Since the end part of this via-hole 8 exposed on the major surface 5a of the first unit wiring layer 5 is accurately flattened, the electrical connection between the first unit wiring layer 5 and the second unit wiring layer 6 formed above the first unit wiring layer 5 by a process that will be described later can be realized by connection of their respective via-holes 8, that is, the above-described via-on-via structure. This via-on-via structure enables the shortest electrical connection of the unit wiring layers and also enables reduction in the area of the high-frequency circuit unit 2.

Figure 14:
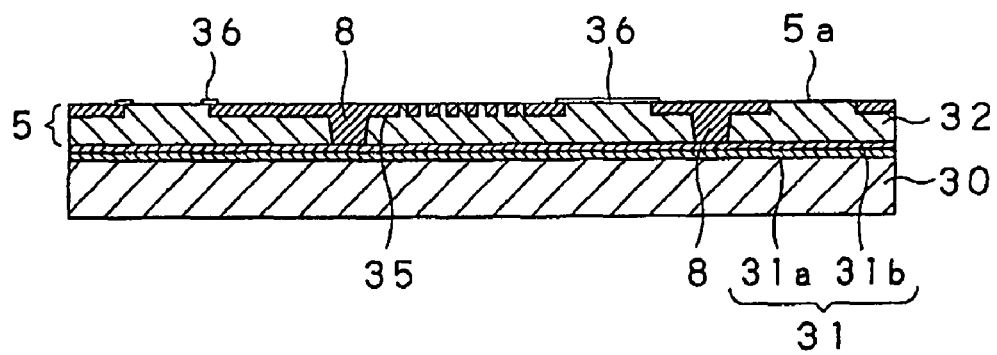
FIG. 14 is a longitudinal sectional view showing a state where a receiving electrode part is formed on the first unit wiring layer.

Next, on the one surface 5a of the first unit wiring layer 5, a receiving electrode part 36 to be a lower electrode of the capacitor 12 or a receiving electrode of the resistor 13 is formed as a passive element part, as shown in FIG. 14. When forming this receiving electrode part 36, a first metal film made of a metal such as titanium with a thickness of approximately 200 Å over the entire major surface 5a of the first unit wiring layer 5 having the via-hole 8, by a sputtering method, evaporation method or the like. Then, a second metal film made of a metal such as Cu, Al, Au or Pt with a thickness of approximately 2000 Å is formed over the entire surface of the first metal film.

Next, a mask is formed in a region where the receiving electrode part 36 is to be formed, on the major surface of the second metal film, and etching processing is performed in the non-masked region. This etching processing is wet etching using mixed acid formed by mixing nitric acid, sulfuric acid, acetic acid and the like at a predetermined proportion, as an etchant. In this etching processing, since the corrosiveness of the mixed acid etchant is low with respect to the titanium metal, it is possible to corrode only the non-masked second metal film by performing the etching processing until the first metal film is exposed.

Next, etching processing is performed on the non-masked first metal film. This etching processing is wet etching using mixed acid formed by mixing fluoric acid ammonium and ammonium hydride-difluoride or the like at a predetermined proportion, as an etchant, or plasma etching using CF4 plasma or the like. In this etching processing, since the corrosiveness of the etchant or CF4 plasma is low with respect to metals other than the titanium metal, it is possible to corrode only the first metal film. In this manner, the receiving electrode part 36 is formed by the first metal film and the second metal film on the first unit wiring layer 5.

Figure 15:
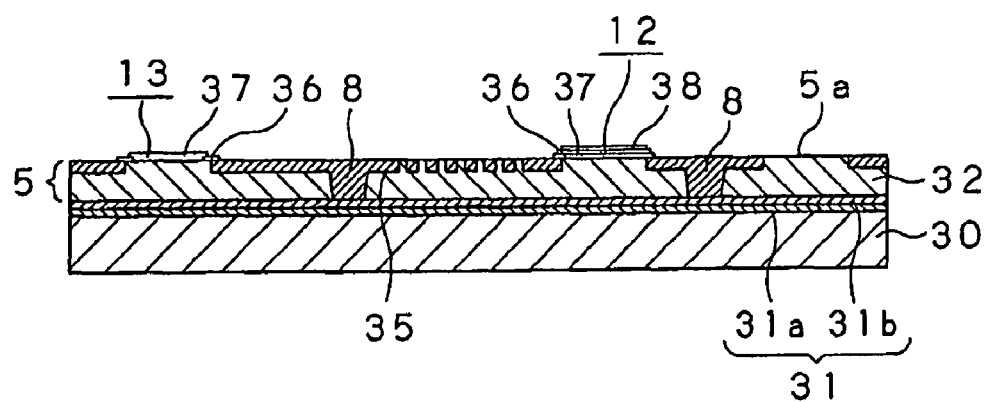
FIG. 15 is a longitudinal sectional view showing a state where a passive element part is formed on the first unit wiring layer.

Next, the capacitor 12 and the resistor 13 are formed as passive element parts so that they are connected with the receiving electrode parts 36, as shown in FIG. 15. When forming these passive element parts, first, a tantalum nitride (TaN) film is formed on the entire surface 5a of the first unit wiring layer 5 so that it covers the receiving electrode parts 36. This TaN film is a base film of a tantalum oxide (TaO) dielectric film that is to be the capacitor 12 by anode oxidation. As a method for forming this TaN film, a sputtering method or the like that enables formation to a thickness of, for example, approximately 2000 Å, is preferred.

Next, on the TaN layer, a mask is formed for performing anode oxidation of only the parts where the capacitor 12 and the resistor 13 are to be formed. On the TaN layer, only the parts exposed outward from openings in the mask are to be anode-oxidized. Then, anode oxidation processing is performed at the parts of the TaN layer exposed outward from openings in the mask. In this anode oxidation processing, as a voltage of 50 to 200 V is applied so that TaN becomes the anode in an electrolyte solution of ammonium borate or the like, the TaN layer is oxidized to form a TaO layer. It is possible to form a TaO layer with a desired thickness by adjusting the voltage applied to the TaN layer.

Next, the mask formed on the TaN layer on which anode oxidation processing has been performed is removed. Thus, the TaO layer formed by selectively oxidizing the surface of the TaN layer can be used as the dielectric material of the capacitor 12. Then, dry etching or the like is performed on the TaO layer in the state where the sites for formation of the capacitor 12 and the resistor 13 are masked with a resist or the like, and the mask is then removed, thus simultaneously forming a dielectric film 37 for the capacitor 12 and the resistor 13. In this manner, the passive element parts such as the capacitor 12 and the resistor 13 are formed on the first unit wiring layer 5. Since these passive element parts are formed on the major surface 5a of the first unit wiring layer 5 that is accurately flattened, the passive element parts can be formed accurately and improvement in the high-frequency characteristic can be realized. The capacitor 12 may also be formed by using a BST (Ba, SR, Ti, O) film, STO (Sr, Ti, O) film or the like as the dielectric film 37.

Next, an upper electrode part 38 is formed on the capacitor 12. This upper electrode part 38 is formed via an underlying layer of Cr, Ni, Ti or the like for improving the adhesion of the metal film of Al, Cu, Pt, Au or the like. In the case where Al or Cu is used for the metal film, the upper electrode part 38 is formed to a thickness of approximately 2000 Å by a sputtering method or the like so as to cover the passive element parts on the first unit wiring layer 5 and then shaped into a predetermined pattern by masking and etching or the like.

Figure 16:
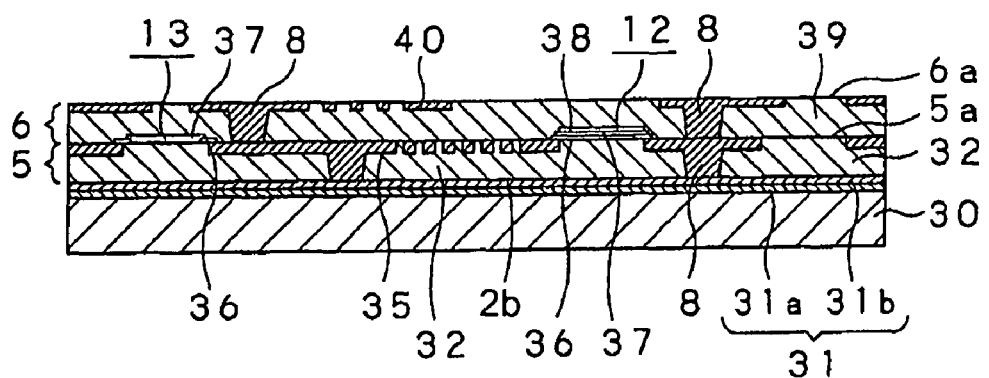
FIG. 16 is a longitudinal sectional view showing a state where a second unit wiring layer is formed on the first unit wiring layer.

Next, on the first unit wiring layer 5, the second unit wiring layer 6 is stacked and formed to cover the passive element parts formed on the one surface 5a, as shown in FIG. 16. This second unit wiring layer 6 is formed by the same process as the first unit wiring layer, using the same material as the first unit layer. The second unit wiring layer 6 includes a second insulating layer 39 and a second pattern wiring 40. In the second unit wiring layer 6, in the case where a photosensitive insulating dielectric material is used for the second insulating layer 39, deviation of the focal point of a patterning image formed by photolithography processing is restrained and the second pattern wiring 40 and the via-hole 8 can be accurately formed because the second insulating layer 39 is formed on the accurately flattened first unit wiring layer 5 and has no variance in its thickness.

Since the second unit wiring layer 6 is formed on the one surface 5a of the first unit wiring layer 5 that is accurately flattened, the second pattern wiring 40 is accurately formed. Flattening processing using the above-described CMP method is performed on one surface 6a of the second unit wiring layer 6 where the pattern wiring 40 is exposed, and this one surface 6a is accurately flattened as the one surface 5a of the first unit wiring layer 5.

Figure 17:
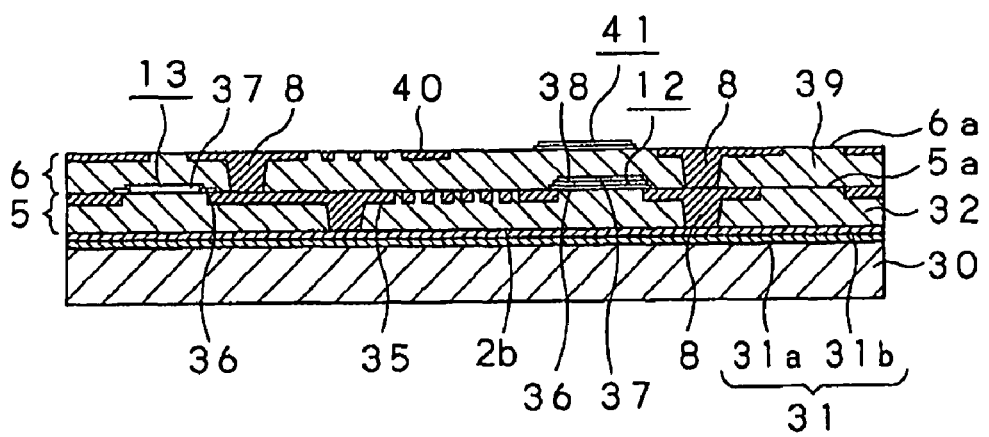
FIG. 17 is a longitudinal sectional view showing a state where a passive element part is formed on the second unit wiring layer.

Next, a capacitor 41 is formed as a passive element part on the one surface 6a of the second unit wiring layer 6, as shown in FIG. 17. This capacitor 41 is formed by the same forming process as the capacitor 12 formed on the one surface 5a of the first unit wiring layer 5. Again, since the capacitor 41 is formed on the major surface 6a of the second unit wiring layer 6 that is accurately flattened, the capacitor 41 is accurately formed and improvement in the high-frequency characteristic is realized.

Figure 18:
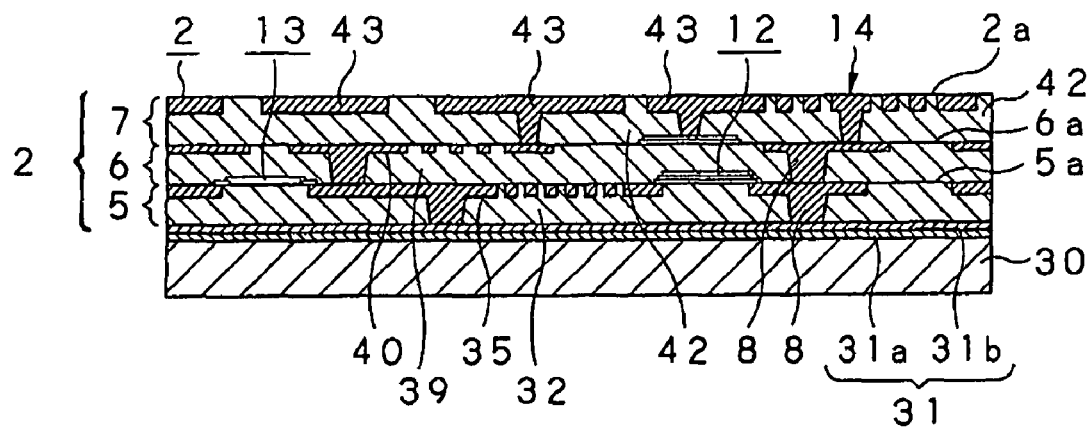
FIG. 18 is a longitudinal sectional view showing a state where a high-frequency circuit unit is formed on the dummy board.

Next, on the major surface 6a of the second unit wiring layer 6, a third unit wiring layer 7 including a third insulating layer 42 and a third pattern wiring 43 is formed by a procedure similar to the procedure of forming the first unit wiring layer 5, as shown in FIG. 18. Since this third unit wiring layer 7 is formed on the one surface 6a of the second unit wiring layer 6 that is accurately flattened, the third pattern wiring 43 and the via-hole 8 are accurately formed. Moreover, in the third unit wiring layer 7, an inductor 14 is accurately formed at a part of the third pattern wiring 43.

In the above-described manner, the high-frequency circuit unit 2 having the accurately flattened connection surface 2a facing the base board 3, which is the uppermost surface, is prepared. In the high-frequency circuit unit 2 thus prepared, since it is possible to form only necessary parts of the unit wiring layers having highly accurate pattern wirings on the one surface 30a of the dummy board 30, miniaturization and reduction in cost can be realized.

Although the unit wiring layers in this high-frequency circuit unit 2 are formed as a three-layer structure, the unit wiring layers are not limited to this structure. As the process of forming the first unit wiring layer 5 is repeated, three or more unit wiring layers can be constructed. Moreover, while in the high-frequency circuit unit 2, the pattern wiring in each unit wiring layer is formed in a manner of being embedded in the insulating layer, the pattern wiring is not limited to this structure. For example, the pattern wiring can be formed by a conventional thin film forming technique such as a semi-additive method.

Figure 19:
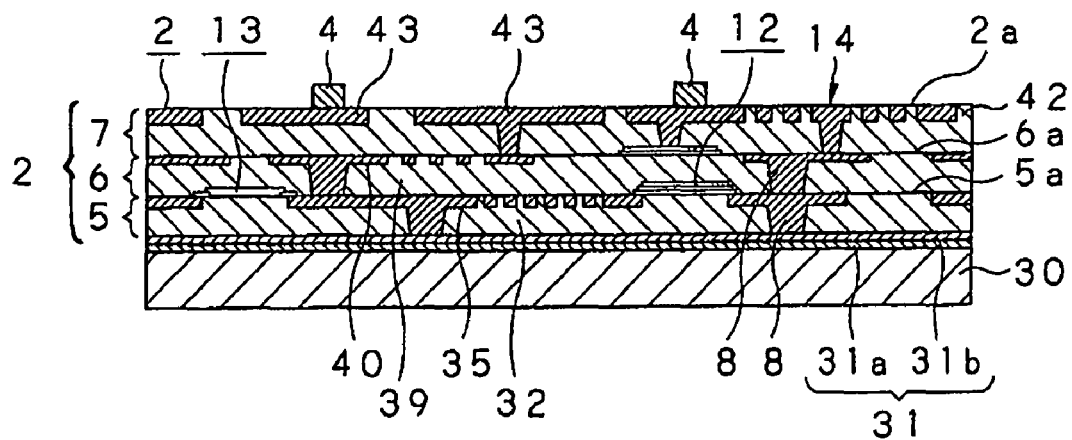
FIG. 19 is a longitudinal sectional view showing a state where a bump part is formed on the high-frequency circuit unit.

Next, in the high-frequency circuit unit 2, the bump part 4 made of solder or the like is formed at a predetermined position on the third pattern wiring 43 exposed on the connection surface 2a, as shown in FIG. 19. The bump part 4 functions as an electrically connecting part when mounting the high-frequency circuit unit 2 on the base board 3. The bump part 4 may be formed as a nickel/copper plating layer, for example, by electroplating or electroless plating. In the high-frequency circuit unit 2, since the dummy board 30 is used as a supporting board, no flexure occurs and the bump part 4 can be accurately formed on the accurately flattened connection surface 2a.

Figure 20:
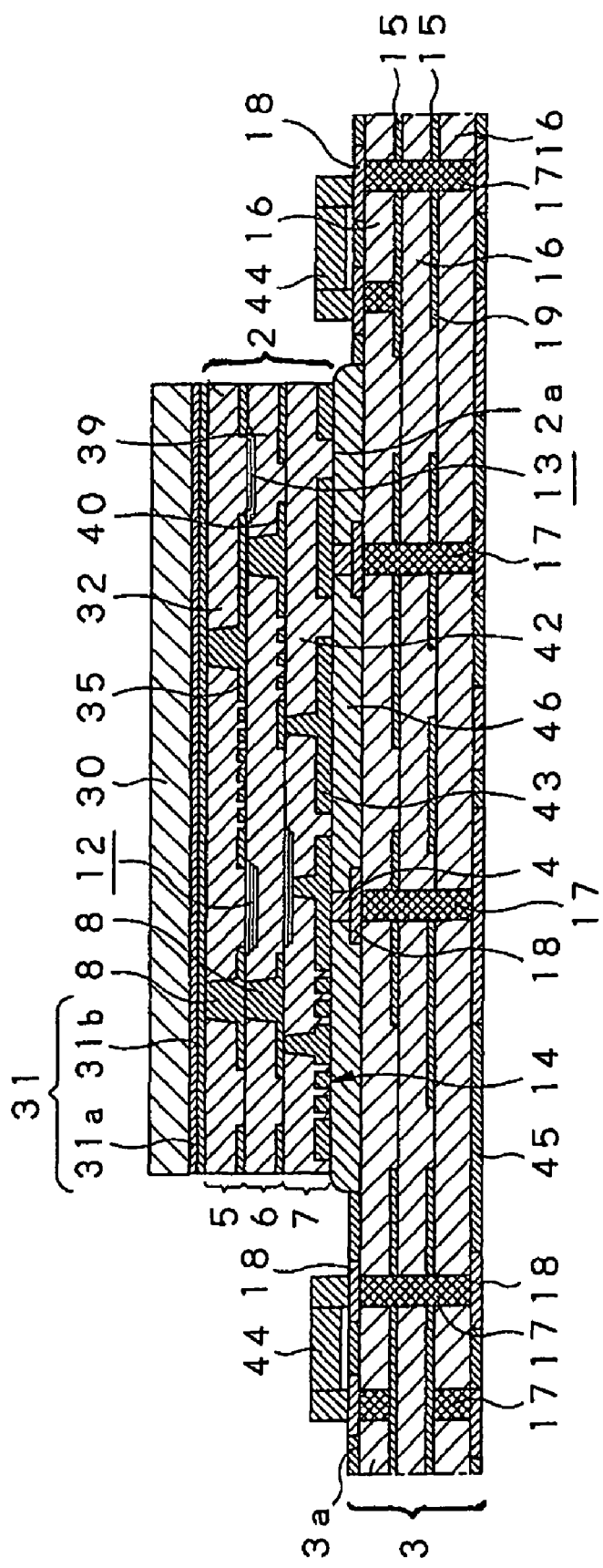
FIG. 20 is a longitudinal sectional view showing a state where the high-frequency circuit unit is mounted on the base board.

Next, the high-frequency circuit unit 2 is reversed so that the connection surface 2a faces the base board 3, and the high-frequency circuit unit 2 is mounted on the base board 3 together with other semiconductor chips 44, as shown in FIG. 20. The base board 3 has the plural wiring layers 15 in which the ground parts 19 or the like are provided, and on a mounting surface 3a, which is one surface where the high-frequency circuit unit 2 and the like are mounted, the input/output terminal parts 18 exposed from a protection layer 45 formed by a resist or the like are formed.

As the high-frequency circuit unit 2 is electrically connected with the input/output terminal parts 18 exposed on the mounting surface 3a of the base board 3 via the bump parts 4 formed on the connection surface 2a, the high-frequency circuit unit 2 is mounted on the base board 3. Specifically, an under-filler 46 is filled between the high-frequency circuit unit 2 and the base board 3 with the bump parts 4 and the input/output terminal parts 18 facing each other, and the under-filler 46 is heated, for example, in a solder reflow tank or the like. The input/output terminal parts 18 and the bump parts 4 are thus electrically connected, and the high-frequency circuit unit 2 is mounted on the mounting surface 3a of the base board 3.

Figure 21:
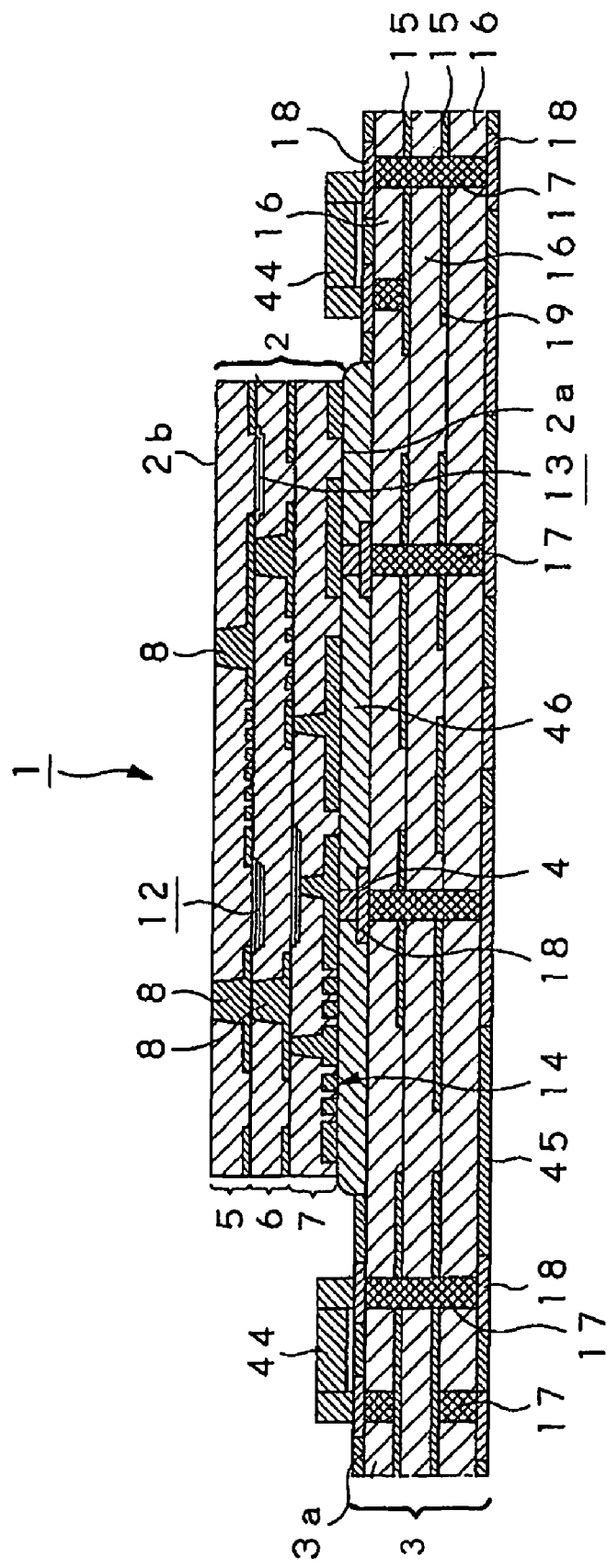
FIG. 21 is a longitudinal sectional view showing a high-frequency module device manufactured by the method of this invention.

Next, the dummy board 30 is removed together with the strip layer 31 from the high-frequency circuit unit 2, as shown in FIG. 21. Specifically, as the high-frequency circuit unit 2 and the base board 30, including the dummy board 30 and the strip layer 31, are impregnated with an acid solution of hydrochloric acid, nitric acid or the like, the acid solution slightly dissolves the metal film 31a of the strip layer 31 and enters between the metal film. 31a and the resin film 31b, thus causing separation of the metal film 31a and the resin film 31b. The dummy board 30 is thus removed in the state where the resin film 31b is left on the other surface 2b opposite to the connection surface 2a. The dummy board 30 may also be removed from the high-frequency circuit unit 2, for example, by laser abrasion processing.

Next, the resin film 31b left on the other surface 2b of the high-frequency circuit unit 2 is removed, for example, by dry etching method using oxygen plasma or the like. This causes the via-hole 8 to be exposed on the other surface 2b of the high-frequency circuit unit 2. In the high-frequency circuit unit 2, since the major surface 30a of the dummy board 30 facing the other surface 2b is highly flattened, the other surface 2b facing the one surface 30a of the dummy board 30 is highly flattened, too. The dummy board 30 may be reused, when necessary.

The high-frequency module device 1 constituted by the high-frequency circuit unit 2 and the base board 3 is thus manufactured.

In the high-frequency module device 1 manufactured in the above-described manner, the high-frequency circuit unit 2 having the first to third unit wiring layers 5 to 7 stacked and formed on the flattened major surface 30a of the dummy board 30 is mounted on the mounting surface 3a of the base board 3 in such a manner that the third pattern wiring 43 exposed on the connection surface 2a of the high-frequency circuit unit 2 and the input/output terminal part 18 exposed on the mounting surface 3a of the base board 3 are connected with each other via the bump part 4, and the dummy board 30 is then removed from the high-frequency circuit unit 2. Therefore, the high-frequency circuit unit 2 is mounted in a predetermined range on the mounting surface 3a of the base board 3.

In this high-frequency module device 1, since the high-frequency circuit unit 2 is formed on the flattened one surface 30a of the dummy board 30, passive elements such as the capacitor 12, resistor 13 and inductor 14 and wirings can be accurately formed. The arrangement of the wirings can be made high-density to realize reduction in area, and the high-frequency characteristic can be improved.

In this high-frequency module device 1, as only the necessary parts of the high-frequency circuit unit 2 having the accurate pattern wirings are formed on the major surface 30a of the dummy board 30, it is possible to mount only the necessary parts of the high-frequency circuit unit 2 on the mounting surface 3a of the base board 3. Therefore, miniaturization and reduction in cost can be realized.

In this high-frequency module device 1, the plural wiring layers 15 functioning as the wirings for transmitting power, control signals, high-frequency signals and the like to the high-frequency circuit unit 2 and the ground part 19 are provided within the base board 3, and lands and wires for supplying power, which must be provided around the high-frequency circuit unit on the mounting surface of the base board in the conventional technique, are not necessary. Therefore, further reduction in the area can be realized.

In this high-frequency module device 1, since the wiring layers 15 and the ground part 19 having sufficient areas are formed on the side of the base board 3, highly regulated power supply to the high-frequency circuit unit 2 can be carried out.

In this high-frequency module device 1, as the high-frequency circuit unit 2 stacked and formed on the major surface 30a of the dummy board 30 is reversed and mounted on the base board 3 together with the dummy board 30, the high-frequency circuit unit 2, which is a precision member, can be easily handled and the yield in manufacturing can be improved.

On the high-frequency module device 1, the functional element 9 such as a semiconductor chip or LSI chip is mounted.

Figure 22:
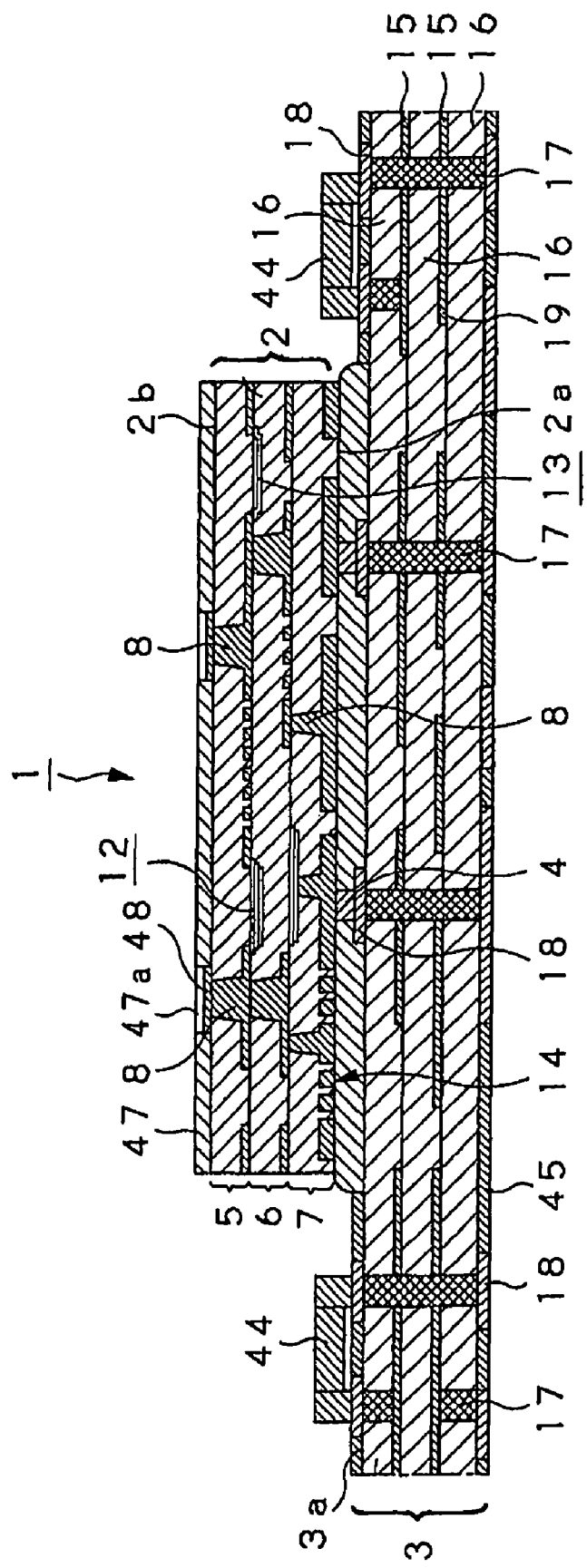
FIG. 22 is a longitudinal sectional view showing a state where a base unit is formed on a high-frequency circuit unit, for explaining a process of mounting a functional element on the high-frequency module device manufactured by the method of this invention.

Specifically, when mounting the functional element 9 on the high-frequency module device 1, a resist layer 47 covering the other surface 2b of the high-frequency circuit unit 2 is formed, as shown in FIG. 22. For this resist layer 47, for example, a solder resist, insulating dielectric material or the like is used. Next, photolithography processing is performed on the resist layer 47 via a mask patterned in predetermined shape, thereby forming an opening 47a from which the via-hole 8 is exposed, at a predetermined position. Next, electroless nickel/copper plating is performed right above the via-hole 8 exposed from the opening 47a, thus forming a base part 48 of the element bump part 10.

Figure 23:
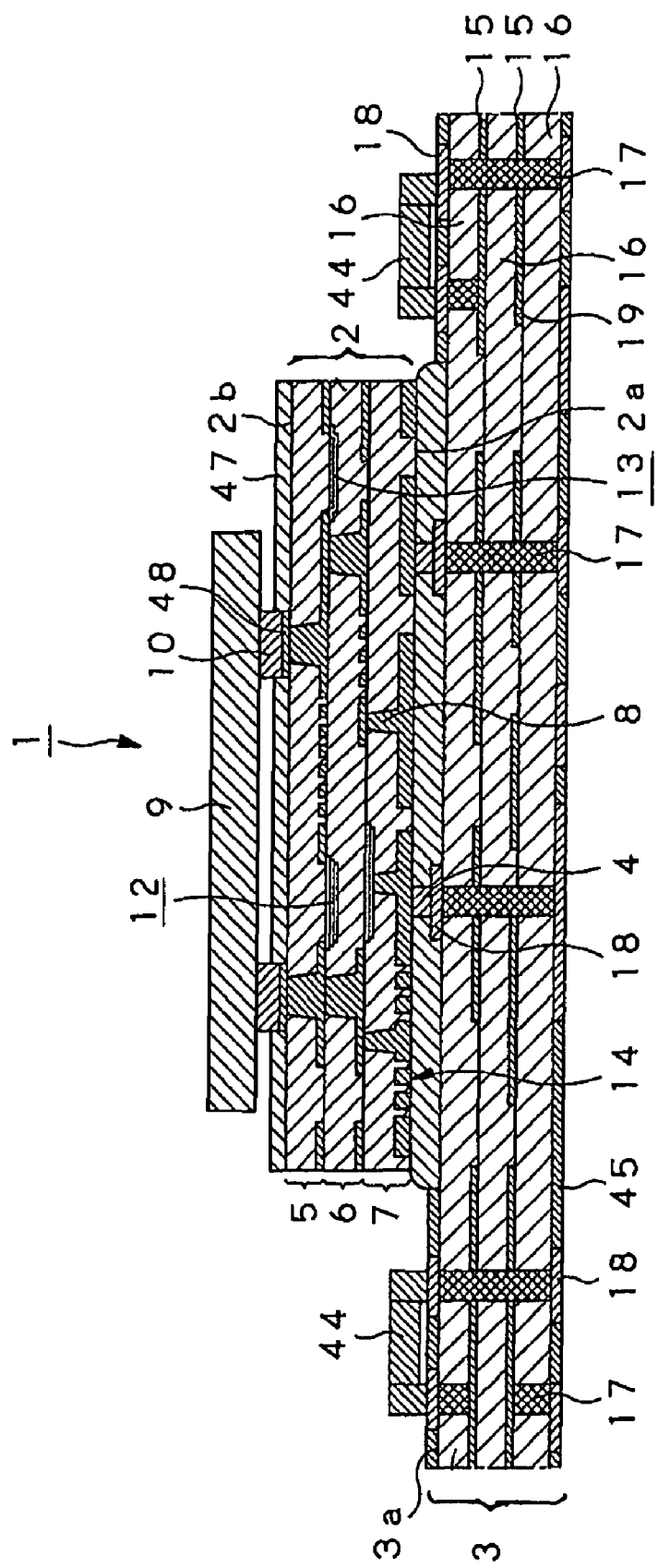
FIG. 23 is a longitudinal sectional view showing a state where the functional element is mounted on the high-frequency circuit unit, for explaining the process of mounting the functional element on the high-frequency module device.

Next, in the high-frequency module device 1, the functional element 9 such as a semiconductor chip or LSI chip is mounted above the other surface 2b of the high-frequency circuit unit 2, as shown in FIG. 23. This functional element 9 is electrically connected with the base part 48 formed on the other surface 2b of the high-frequency circuit unit 2 via the element bump part 10 by a flip-chip bonding method. The method for mounting the functional element 9 is not limited to the flip-chip bonding method. For example, a face-down mounting method such as a TAB (tape automated bonding) method or lead beam bonding method may be used.

Figure 24:
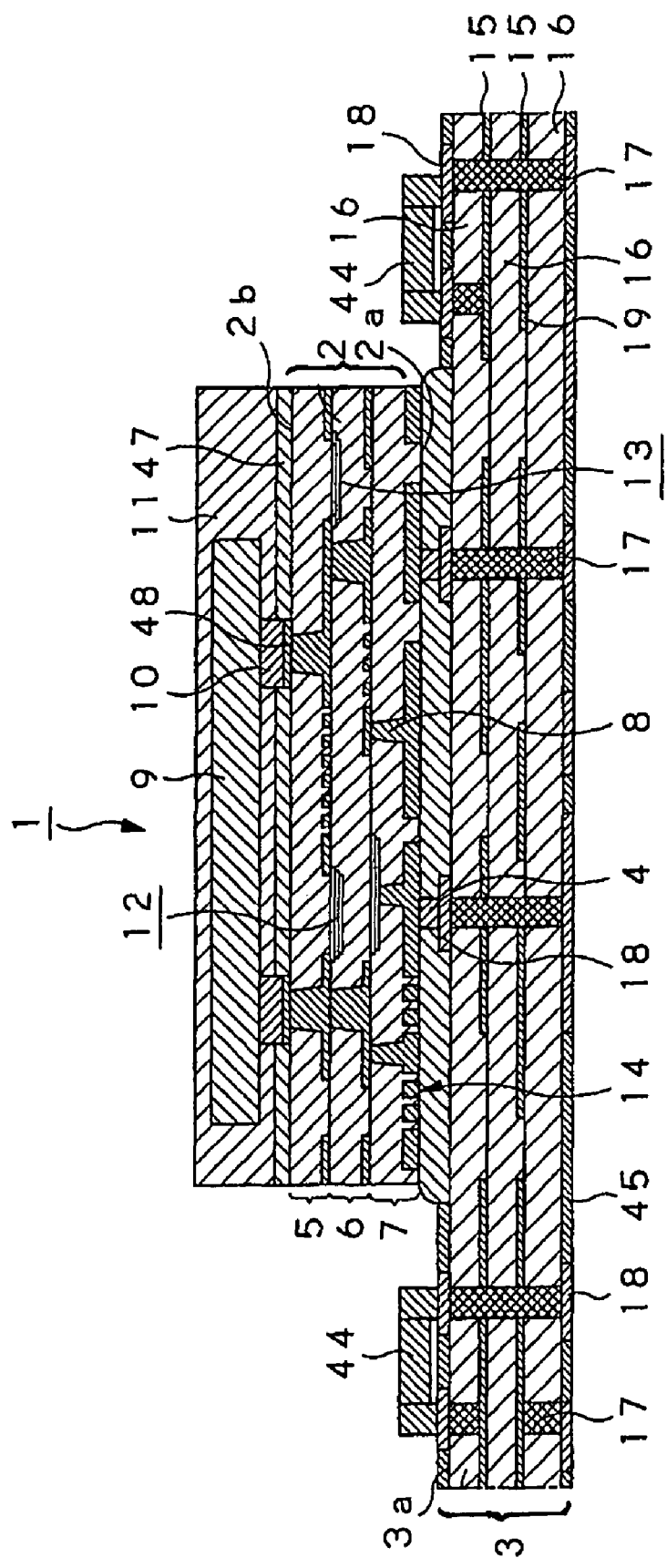
FIG. 24 is a longitudinal sectional view showing a state where a resin layer covering the functional element is formed, for explaining the process of mounting the functional element on the high-frequency module device.

Next, in the high-frequency module device 1, the resin layer 11 is formed so as to cover the mounted functional element 9, as shown in FIG. 24. The resin layer 11 is formed over the entire other surface 2b of the high-frequency circuit unit 2, for example, by a transfer mold method, printing method or the like, so that the resin is filled between the functional element 9 and the first unit wiring layer 5. For the resin layer 11, a resin having a small contraction rate due to thermosetting, for example, an epoxy resin or the like, is used. This prevents deformation such as warping of the first to third unit wiring layers 5 to 7 due to contraction of the resin layer 11 at the time of thermosetting.

Figure 25:
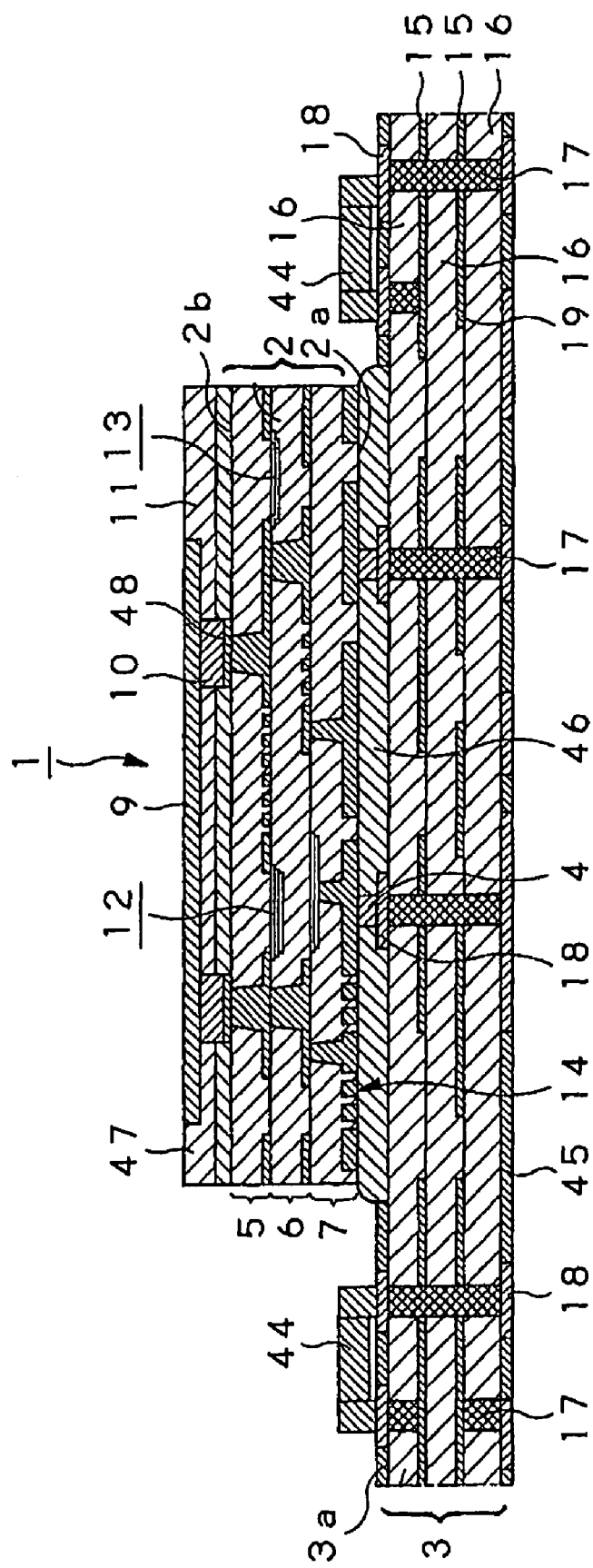
FIG. 25 is a longitudinal sectional view showing a state where the functional element and the resin layer are polished, for explaining the process of mounting the functional element on the high-frequency module device.

Next, polishing processing is performed on the functional element 9 and the resin layer 11, as shown in FIG. 25. This polishing processing is performed, for example, by a mechanical polishing method using a grinder, a chemical polishing method using wet etching, or a CMP method using both of these polishing methods. Together with the resin layer 11, the functional element 9 is polished to a limit thickness where its function is not disturbed. In this polishing processing, the base board 3 is used as a supporting base for the functional element 9 and the resin layer 11, and polishing is performed in such a manner that no step is generated between the functional element 9 and the resin layer 11 where the resin layer 11 is embedded around the functional element 9 in the polishing direction. Therefore, edge breakage of the functional element 9 can be prevented. In the above-described manner, the functional element 9 is mounted on the high-frequency module device 1.

In this high-frequency module device 1, even when the functional element 9 is mounted on the other surface 2b of the high-frequency circuit unit 2, the polishing processing on the functional element 9 and the resin layer 11 enables reduction in the overall thickness.

Figure 26:
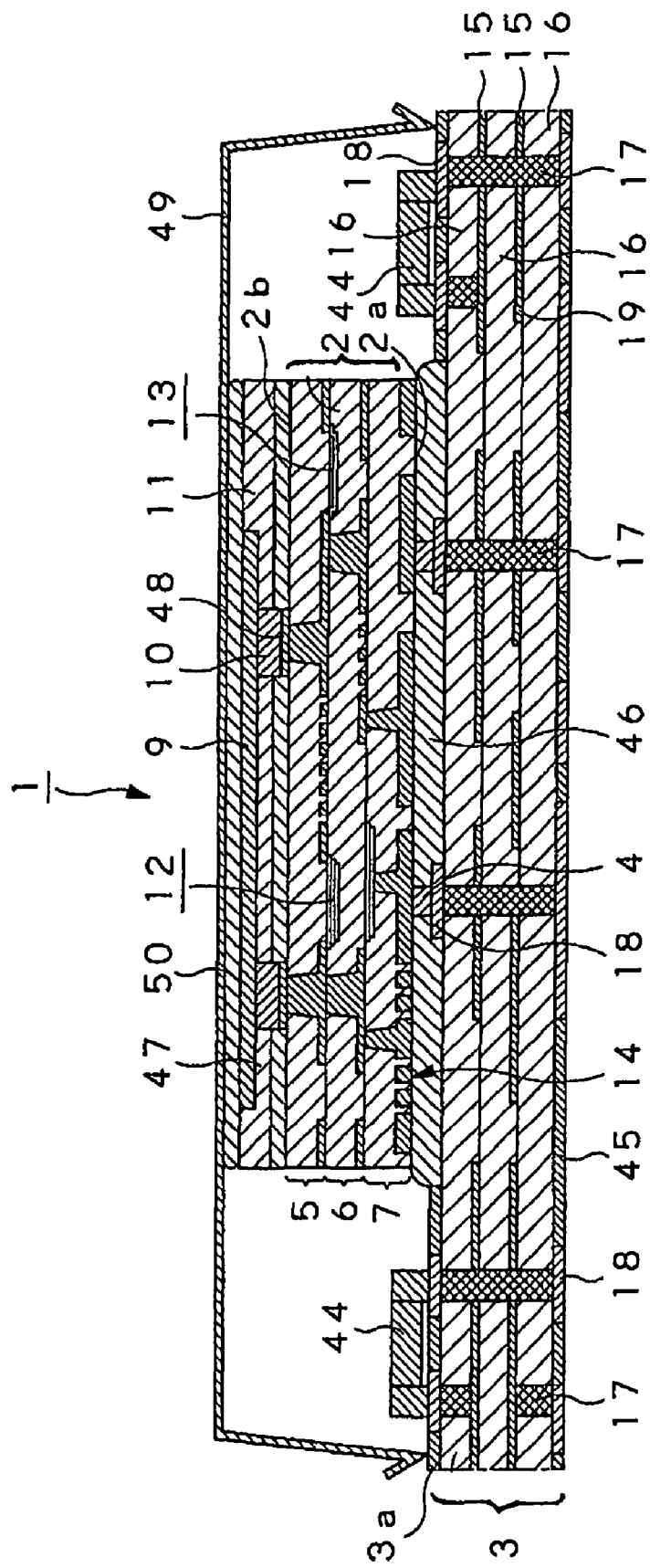
FIG. 26 is a longitudinal sectional view showing a state where a shield cover and a thermally conductive resin member are incorporated in the high-frequency module device.

In this high-frequency module device 1, a shield cover 49 for eliminating the influence of electromagnetic noise is incorporated so as to cover the high-frequency circuit unit 2 and the semiconductor chips 44 mounted on the mounting surface 3a of the base board 3 via the bump parts 4, as shown in FIG. 26.

Therefore, in the high-frequency module device 1, since the high-frequency circuit unit 2 and the semiconductor chips 44 are covered by the shield cover 49, the heat generated by the functional element 9 in the high-frequency circuit unit 2 and the semiconductor chips 44 on the mounting surface 3a of the base board 3 may fill the space within the shield cover 49 and adversely affect the high-frequency characteristic. Therefore, it is preferred that a suitable radiation structure is provided in the high-frequency module device 1.

Specifically, in the high-frequency module device 1, a thermally conductive resin member 50 is filled between the high-frequency circuit unit 2 and the shield cover 49, thus constituting a radiation structure. In the high-frequency module device 1, the heat from the functional element 9 mounted on the high-frequency circuit unit 2 is transmitted to the shield cover 49 via the thermally conductive resin member 50. As the shield cover 49 serves as a radiation part, the heat is prevented from filling the space within the shield cover 49 and adversely affecting the high-frequency characteristic. In the high-frequency module device 1, as the high-frequency circuit unit 2 is held by the thermally conductive resin member 50 and the shield cover 49, the mechanical mounting rigidity is improved.

Figure 27:
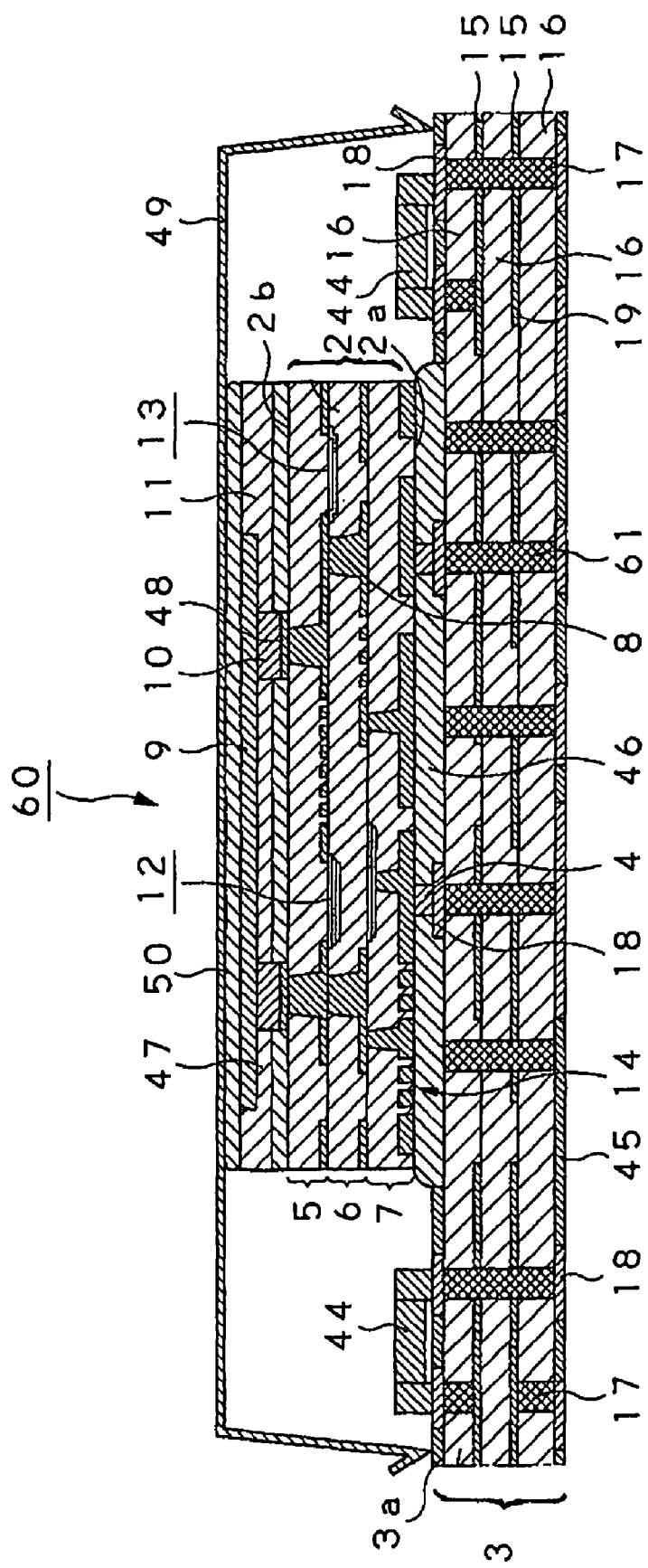
FIG. 27 is a longitudinal sectional view showing a state where a cooling via-hole is formed within the base board of the high-frequency module device.

A high-frequency module device 60 shown in FIG. 27 has a structure that radiates the heat generated by the high-frequency circuit unit 2 and the semiconductor chips 44, more efficiently. In addition to the above-described thermally conductive resin member 50, many cooling via-holes 61 connecting to the inside of the base board 3 are formed, corresponding to the mounting region of the high-frequency circuit unit 2. These cooling via-holes 61 are formed by the same process as the process of forming the via-holes 17 in the mother board 3.

In this high-frequency module device 60, the heat generated by the functional element 9 of the high-frequency circuit unit 2 is radiated from the shield cover 49 via the thermally conductive resin member 50 as described above and is also transmitted to the bottom of the base board 3 via the cooling via-holes 61 and then radiated to outside. In the high-frequency module device 60, as radiation is performed from both the high-frequency circuit unit 2 and the base board 3, efficient radiation is realized. In the high-frequency module device 60, a radiation structure may be constructed by the cooling via-holes 61 alone. In the high-frequency module device 60, the thickness of the wiring layers 15 formed in the base board 3 may be increased to, for example, approximately 50 nm, and the cooling via-holes 61 may be connected to the wiring layers 15 so that radiation is performed from the wiring layers 15.

Figure 28:
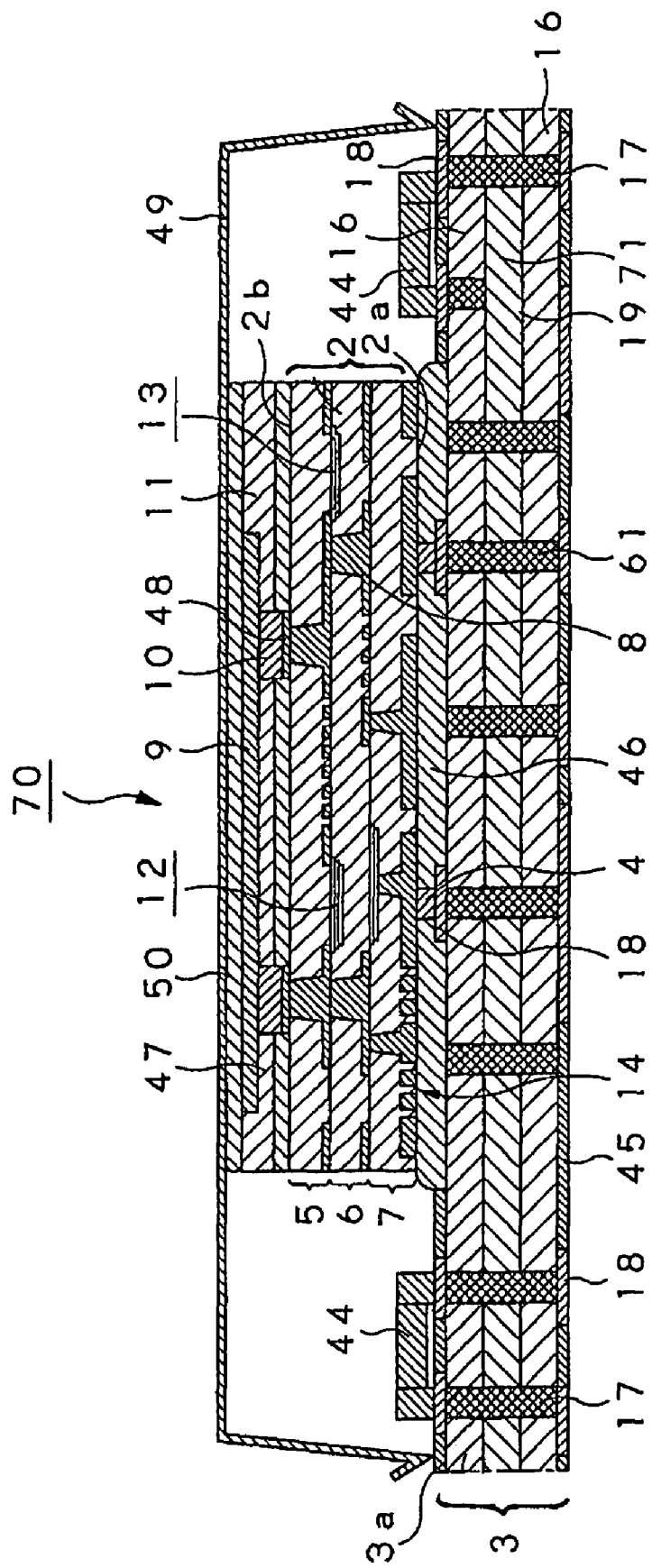
FIG. 28 is a longitudinal sectional view showing a state where a metal core is provided within the base board of the high-frequency module device.

A high-frequency module device 70 shown in FIG. 28 has a structure in which a metal core 71 with good conductivity such as copper or alloy is provided within the base board 3. In the high-frequency module device 70, the above-described many cooling via-holes 61 are connected to the metal core 71. In the high-frequency module device 70, radiation is also performed from the metal core 71 via the cooling via-holes 61, and together with the structure including the above-described thermally conductive resin member 50 and cooling via-holes 61 for radiation, more efficient radiation is performed and reliability is improved.

It should be understood by those ordinarily skilled in the art that the invention is not limited to the above-described embodiments, but various modifications, alternative constructions or equivalents can be implemented without departing from the appended claims and the scope of this invention.

INDUSTRIAL APPLICABILITY

According to this invention, a high-frequency circuit unit is formed on flattened one surface of a dummy board so that a wiring layer having a passive element can be accurately formed. Therefore, a high-frequency module device in which high-density arrangement of wirings and hence reduction in area can be realized and which has improved high-frequency characteristics can be manufactured.

Moreover, according to this invention, only a necessary part of a high-frequency circuit unit having a highly accurate wiring layer is formed on one surface of a dummy board so that it is possible mount only the necessary part of the high-frequency circuit unit on a base board. Therefore, a high-frequency module device in which miniaturization and reduction in cost are realized can be manufactured.

Therefore, according to this invention, a high-frequency module device that can be broadly used as a high-frequency circuit having excellent high-frequency characteristics and realizing miniaturization, reduction in thickness and lower cost can be manufactured.

The invention claimed is:

1. A method of manufacturing a high-frequency module comprising the steps of:
   forming a high-frequency circuit unit on a dummy substrate, the high-frequency circuit unit including a plurality of wiring layers, each with a corresponding insulating layer, wherein at least two of the wiring layers include a passive element and wherein at least some of the wiring layers are electrically interconnected;
   mounting the high-frequency circuit unit on a surface of a circuit board having a connection part formed thereon and a plurality of wiring layers and wherein the dummy substrate is secured to the high-frequency circuit when the high-frequency circuit is mounted to the surface of the circuit board; and
   removing the dummy substrate from the high-frequency circuit unit and thereafter mounting a semiconductor integrated circuit to the side of the high-frequency circuit unit at which the dummy substrate was located; and
   further comprising forming a shield structure over the circuit board which covers the semiconductor integrated circuit and wherein a thermally conductive resin covers an uppermost surface of the high-frequency circuit unit and directly contacts the shield structure.

2. The method for manufacturing a high-frequency module device as claimed in claim 1, wherein at the circuit unit forming step, one or more of an inductor, a resistor and a capacitor are formed as the passive element provided in the unit wiring layers.

3. The method for manufacturing a high-frequency module device as claimed in claim 1, wherein at the circuit unit forming step, further includes a flattening process for flattening major surfaces of the plural unit wiring layers by chemical-mechanical polishing.

4. The method for manufacturing a high-frequency module device as claimed in claim 1, wherein after the removing step, a semiconductor chip is mounted on a major surface opposite to the major surface of the uppermost layer of the high-frequency circuit unit that is exposed as the dummy substrate is removed.

* * * * *